US012581711B2

(12) United States Patent
Yu et al.

(10) Patent No.:   US 12,581,711 B2
(45) Date of Patent:   Mar. 17, 2026

(54) SEMICONDUCTOR STRUCTURE AND METHOD OF MANUFACTURING THE SAME

(71) Applicant: TAIWAN SEMICONDUCTOR MANUFACTURING COMPANY LTD., Hsinchu (TW)

(72) Inventors: Ke-Jing Yu, Kaohsiung (TW); Yu-Chen Chang, Taoyuan (TW); Anhao Cheng, Taichung (TW); Yen-Liang Lin, Tainan (TW); Ru-Shang Hsiao, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 355 days.

(21) Appl. No.: 18/448,188

(22) Filed: Aug. 11, 2023

(65) Prior Publication Data

US 2025/0054764 A1     Feb. 13, 2025

(51) Int. Cl.
| | |
|---|---|
| *H01L 21/28* | (2025.01) |
| *H01L 21/321* | (2006.01) |
| *H10D 84/01* | (2025.01) |
| *H10D 84/03* | (2025.01) |
| *H10D 84/85* | (2025.01) |

(52) U.S. Cl.
CPC .... *H01L 21/28123* (2013.01); *H01L 21/3212* (2013.01); *H10D 84/0172* (2025.01); *H10D 84/0193* (2025.01); *H10D 84/038* (2025.01); *H10D 84/853* (2025.01)

(58) Field of Classification Search
CPC .......... H01L 21/28123; H01L 21/3212; H10D 84/853; H10D 84/0172; H10D 84/038; H10D 84/0193
See application file for complete search history.

(56) References Cited

U.S. PATENT DOCUMENTS

| | | | |
|---|---|---|---|
| 8,772,109 | B2 | 7/2014 | Colinge |
| 8,785,285 | B2 | 7/2014 | Tsai et al. |
| 8,816,444 | B2 | 8/2014 | Wann et al. |
| 8,823,065 | B2 | 9/2014 | Wang et al. |
| 8,860,148 | B2 | 10/2014 | Hu et al. |
| 9,105,490 | B2 | 8/2015 | Wang et al. |
| 9,236,267 | B2 | 1/2016 | De et al. |
| 9,236,300 | B2 | 1/2016 | Liaw |
| 9,520,482 | B1 | 12/2016 | Chang et al. |
| 9,576,814 | B2 | 2/2017 | Wu et al. |
| 2021/0367059 | A1* | 11/2021 | Lin ...................... H10D 84/038 |

(Continued)

*Primary Examiner* — Christine A Enad
(74) *Attorney, Agent, or Firm* — WPAT LAW; Anthony King

(57)     ABSTRACT

A semiconductor structure includes a substrate with fin features extending along a first direction; a plurality of gate stacks and a plurality of dummy pillars. The gate stacks are deposited over the substrate and extend along a second direction different from the first direction to cover the sidewalls and top surfaces of the fin features exposed from the substrate. Each gate stack includes a first gate region, a second gate region and a central region formed between the first gate region and the second gate region without covering the fin features. The dummy pillars are formed in the gate stacks besides the fin features and/or on the fin features.

20 Claims, 57 Drawing Sheets

(56) References Cited

U.S. PATENT DOCUMENTS

2023/0155006 A1 * 5/2023 Kao ..................... H10D 62/115
                                              257/253
2024/0421004 A1 * 12/2024 Wu ................... H10D 84/0151

* cited by examiner

SEMICONDUCTOR STRUCTURE AND METHOD OF MANUFACTURING THE SAME

BACKGROUND

Semiconductor devices are used in various electronic applications such as, for example, personal computers, mobile phones, digital cameras, and other electronic devices. Semiconductor devices are typically manufactured by sequentially depositing materials for an insulating or dielectric layer, a conductive layer, and a semiconductor layer over a semiconductor substrate, and patterning the various material layers using photolithography to form a plurality of circuit elements and a plurality of elements thereon.

The semiconductor industry is continually increasing the integration density of various electronic components (e.g., transistors, diodes, resistors, capacitors) which allows more components to be integrated within a given area.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
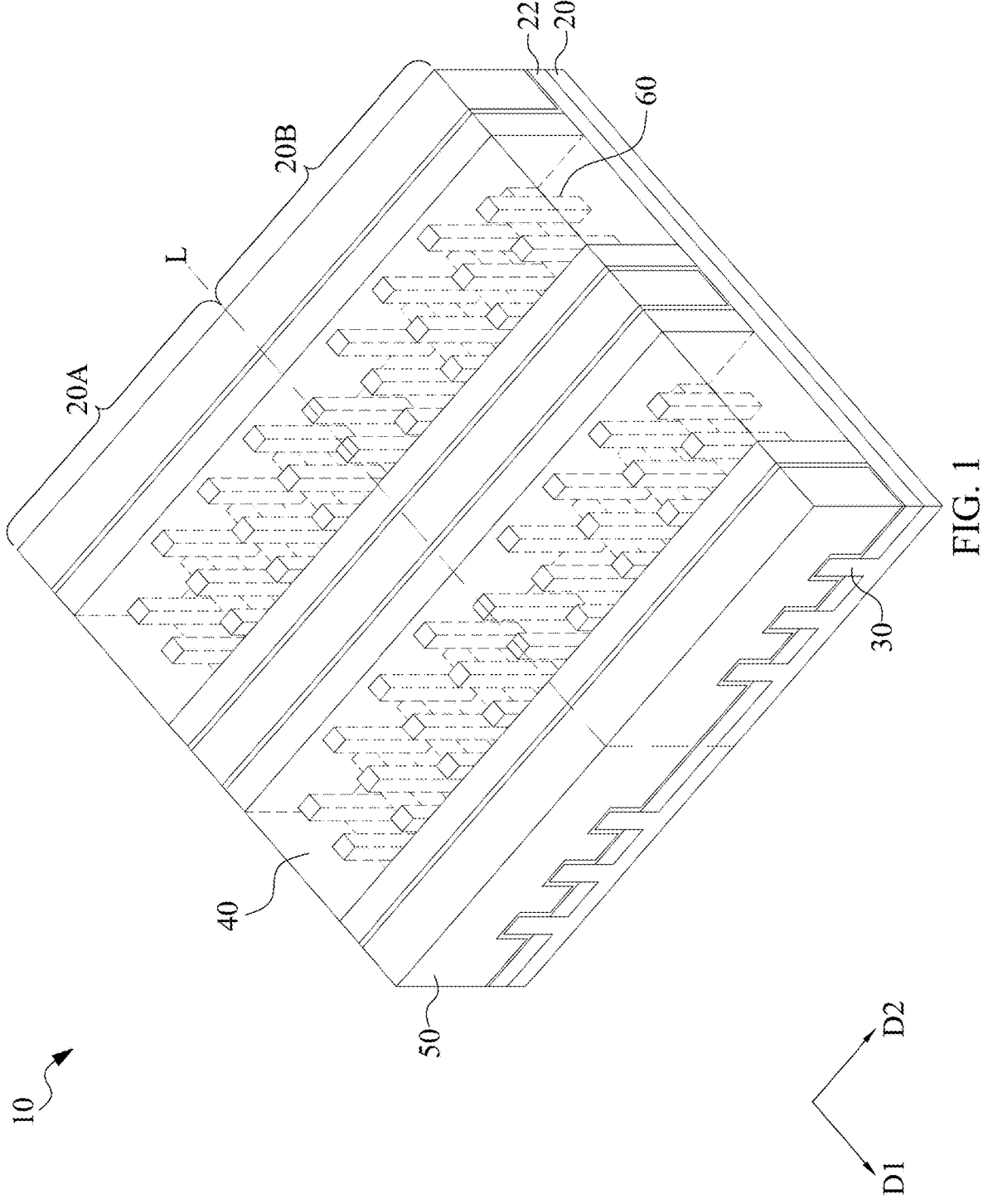
FIG. 1 illustrates a partially perspective view of a semiconductor structure in accordance with some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Also, the components disclosed herein may be arranged, combined, or configured in ways different from the exemplary embodiments shown herein without departing from the scope of the present disclosure. It is understood that those skilled in the art will be able to devise various equivalents that, although not explicitly described herein, embody the principles of the present invention.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present invention relates to semiconductor devices and their fabrication, and more particularly to methods of fabricating Field Effect Transistors (FETs), such as fin FETs (FinFETs), nanostructured transistors (e.g., full gate-all-around FETs (GAA FETs), nanosheet transistors, nanowire transistors, multi-bridge channel FETs, nanoribbon transistors), and/or other FETs. Some embodiments discussed herein are discussed in the context of finfets formed using a gate-last process. In other embodiments, a gate first process may be used. Additionally, some embodiments contemplate aspects for application in other types of multi-gate devices (such as nanostructured transistors) or planar devices (such as planar FETs).

For a large dimension device, the thickness of metal gates needs to be well controlled to avoid defects, such as a convex surface, a concave surface (e.g., dishing) or the like resulted from a chemical mechanical polishing (CMP) procedure, which may lead to mismatch between the device and contacts to be connected thereto. Therefore, it is an object of the present invention to seek to provide, among other things, further improvements in forming metal contact isolation features. Embodiments will be described with respect to a specific context, namely, a FinFET device and a method of forming the same. Various embodiments discussed herein allow for providing a fin based device such that the number of mismatch dislocations (mis-dislocations) is reduced, thereby achieving improved N/P boundary metal topography and vertical profile for better contact landing.

Examples of devices that can benefit from one or more embodiments of the present invention are semiconductor devices. Such a device may include a P-type metal-oxide-semiconductor FinFET device or an N-type metal-oxide-semiconductor FinFET device. The FinFET device may be a dual-gate device, tri-gate device, bulk device, silicon-on-insulator (SOI) device, and/or other configurations. One of ordinary skill may recognize other examples of semiconductor devices that may benefit from aspects of the present disclosure. For example, some embodiments as described herein may also be applied to gate-all-around (GAA) devices, Omega-gate (Ω-gate) devices, or Pi-gate (Π-gate) devices.

FIG. 1 illustrates an example of a semiconductor structure 10 in a three-dimensional view. The semiconductor structure 10 comprises a substrate 20 with a plurality of fin features 30, a plurality of gate stacks 40, a plurality of interval regions 50 and a plurality of dummy pillars 60.

In some embodiments, the substrate 20 is a bulk semiconductor substrate, such as a semiconductor wafer. For example, the substrate 20 is a silicon wafer. The substrate 20 may include silicon or another elementary semiconductor material such as germanium. In some other embodiments, the substrate 20 includes a compound semiconductor. The compound semiconductor may include gallium arsenide, silicon carbide, indium arsenide, indium phosphide, another suitable compound semiconductor, or a combination thereof. In some embodiments, the substrate 20 includes a semiconductor-on-insulator (SOI) substrate. The SOI substrate may be fabricated using a separation by implantation of oxygen (SIMOX) process, a wafer bonding process, another applicable method, or a combination thereof.

As shown in FIG. 1, the substrate 20 is separated into a first portion 20A and a second portion 20B by an imaginary line L. In some embodiments, two or more transistors are formed in and/or over the first portion 20A and the second portion 20B of the substrate 20. In some embodiments, a p-type metal-oxide-semiconductor field effect transistor (PMOSFET) and an n-type metal-oxide-semiconductor field effect transistor (NMOSFET) will be formed in and/or over the first and second portions 20A and 20B, respectively. In some other embodiments, an NMOSFET and a PMOSFET will be formed in and/or over the first and second portions 20A and 20B, respectively. In some other embodiments, NMOSFETs will be formed in and/or over the first and second portions 20A and 20B. In some other embodiments, PMOSFETs will be formed in and/or over the first and second portions 20A and 20B.

The fin features 30 are formed over the substrate 20 and extending along a first direction D1. In some embodiments, the fin features 30 are silicon fins (Si-fins). The layer of silicon may be a silicon layer of an SOI substrate.

The substrate 20 comprises a shallow trench isolation (STI) layer 22 overlaid onto the substrate 20. The STI layer 22 is disposed around at least a portion of the fin features 30 such that at least a portion of the fin features 30 protrudes from the STI layer 22. In the illustrated embodiment, top portions of the fin features 30 protrude from the STI layer 22. Further, top surfaces of the STI layer 22 may have a flat surface as illustrated, a convex surface, a concave surface (such as dishing), or a combination thereof. The top surfaces of the STI layer 22 may be formed flat, convex, and/or concave by an appropriate etch. The STI layer 22 may be recessed using an acceptable etching process, such as one that is selective to the material of the STI layer 22. For example, a chemical oxide removal using a CERTAS® etch, an Applied Materials SICONI tool, or dilute hydrofluoric (dHF) acid may be used.

The gate stacks 40 are deposited over the substrate 20 and extend along a second direction D2 different from the first direction D1 as shown in FIG. 1. The gate stacks 40 are separated by the interval regions 50. Each gate stack 40 is formed along sidewalls and over a top surface of the fin features 30. In some embodiments, the gate stack 40 covers the fin features 30 and the top of the STI layer 22 between the fin features 30.

Figure 2:
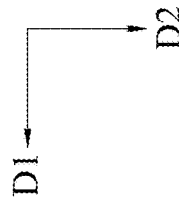
FIG. 2 illustrates a diagrammatic top view of the semiconductor structure shown in FIG. 1 in accordance with some embodiments of the present disclosure.

As illustrated in FIG. 2, in some embodiments, each gate stack 40 has a first gate region 40A formed in the first portion 20A of the substrate 20 to cover the fin features 30 in the first portion 20A, a second gate region 40B formed in the second portion 20B of the substrate 20 to cover the fin features 30 in the second portion 20B and a central region 42.

The central region 42 is located between the first gate region 40A and the second gate region 40B and thus is formed between two adjacent fin features 30 closest to the imaginary line L. The central region 42 comprises an outer barrier 422 formed on the STI layer 22, a conductive layer 424 formed along an inner surface of the outer barrier 422 and a contact area 426 formed in the conductive layer 424; that is, the contact area 426 is surrounded by the conductive layer 424 but a top of the contact area 426 is exposed for connecting a contact 70 (as shown in FIG. 4); the conductive layer 424 is surrounded by the outer barrier 422 but a top of the conductive layer 424 is exposed; and a top of the barrier 422 is exposed.

Figure 3:
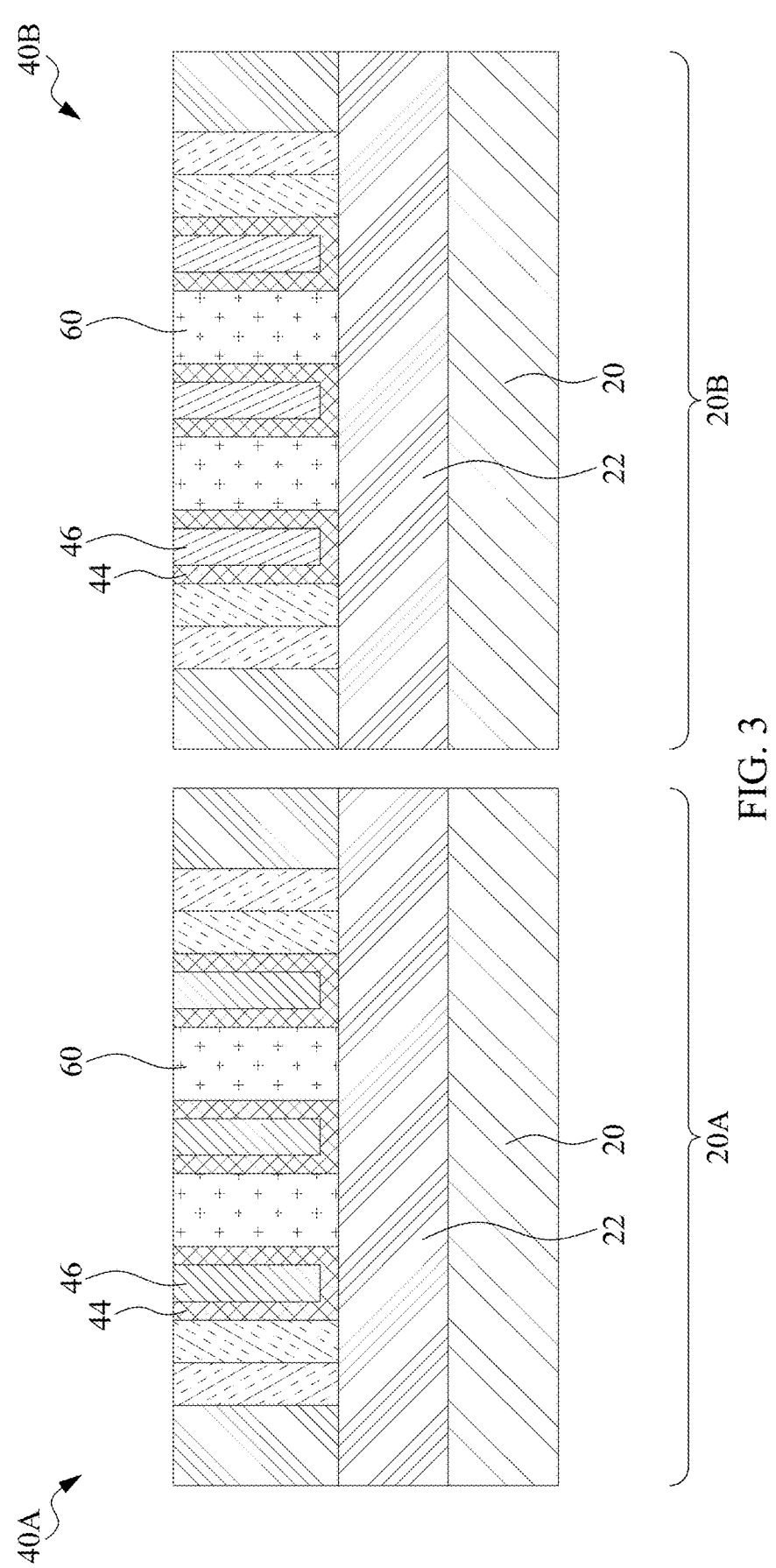
FIG. 3 illustrates a diagrammatic cross-sections $X_1$-$X_1$' and $X_2$-$X_2$' shown in FIG. 2 in accordance with some embodiments of the present disclosure.
Figure 4:
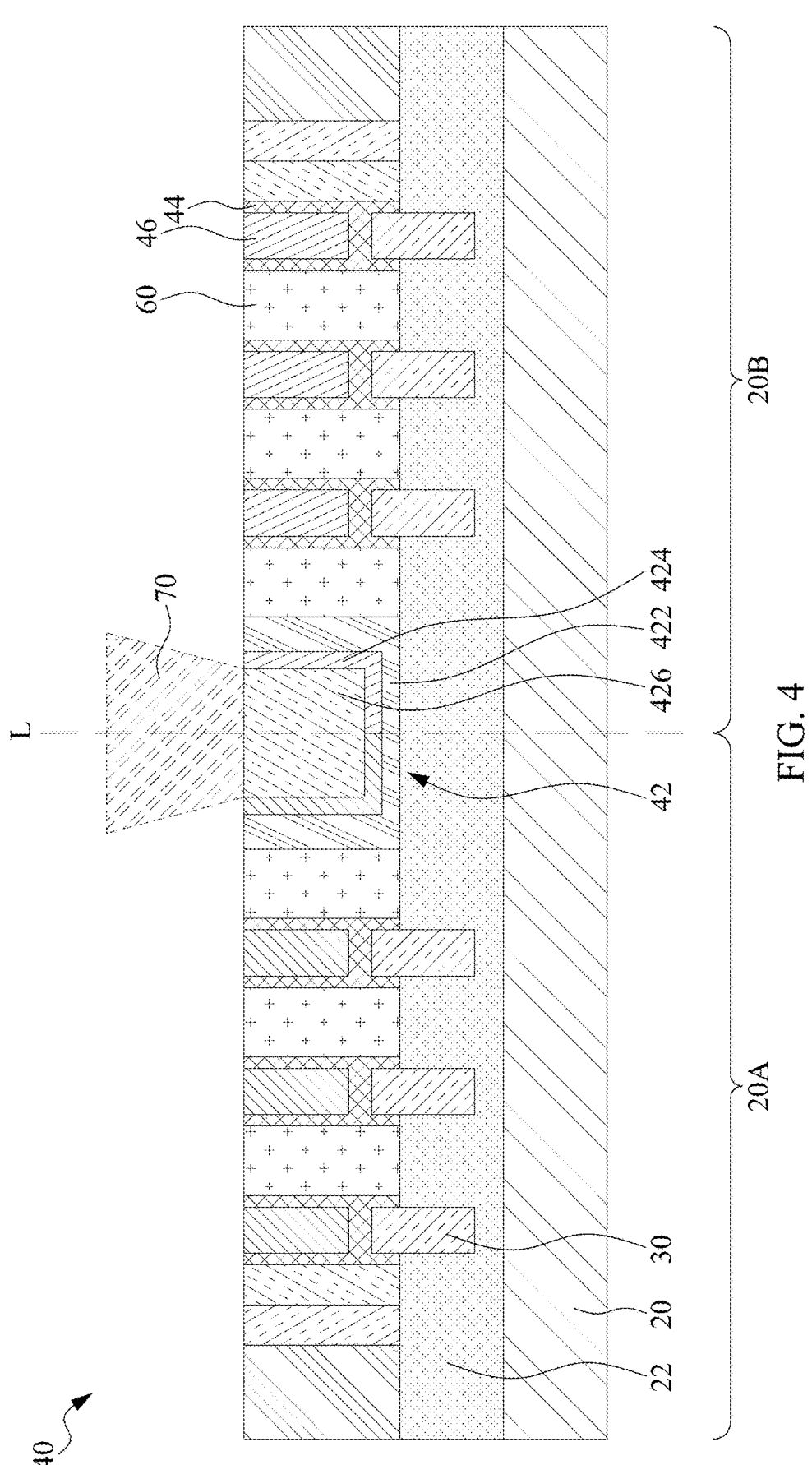
FIG. 4 illustrates a diagrammatic cross-section Y-Y' shown in FIG. 2 in accordance with some embodiments of the present disclosure.

FIGS. 1 to 4 illustrate the dummy pillars 60 in accordance with some embodiments, in which FIG. 3 depicts cross-sections $X_1$-$X_1$' and $X_2$-$X_2$' shown in FIG. 2 and FIG. 4 depicts a cross-section Y-Y' shown in FIG. 2. The dummy pillars 60 are formed in the gate stacks 40 and on the STI layer 22. A top of each dummy pillar 60 may be coplanar with the top of the gate stacks 40. As shown in FIG. 2, the dummy pillars 60 may be formed besides the fin features 30 in the first gate region 40A and the second gate region 40B of the gate stack 40. Also, the dummy pillars 60 are also formed in the central region 42. In some embodiments, the dummy pillars 60 are formed in the contact area 426 of the central region 42. As shown in FIG. 4, the central region 42 may abut one or more dummy pillars 60 in the first gate region 40A and also abut one or more dummy pillars 60 in the second gate region 40B.

As shown in FIGS. 3 and 4, each of the first gate region 40A and the second gate region 40B of the gate stack 40 comprises a gate dielectric 44 and a gate electrode 46. The gate dielectric 44 is formed along sidewalls and over a top surface of the fin feature 30 and along sidewalls of the dummy pillars 60. The gate electrode 46 may be formed in the gate dielectric 44 to expose a top of the gate electrode 46.

In some embodiments, the gate dielectric 44 is made of silicon oxide, silicon nitride, silicon oxynitride, dielectric material with high dielectric constant (high-K, such as $SiO_2$, $Si_3N_4$, $Al_2O_3$, $Y_2O_3$, $TiO_2$, $HfO_2$, $ZrO_2$, ZAZ (a $ZrO_2$/$Al_2O_3$/$ZrO_2$ stack), AZA (a $Al_2O_3$/$ZrO_2$/$Al_2O_3$ stack), ZAZAZ (a $ZrO_2$/$Al_2O_3$/$ZrO_2$/$Al_2O_3$/$ZrO_2$ stack) and so on), another suitable dielectric material, or a combination thereof. Examples of high-K dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof. In some embodiments, the gate dielectric 44 is deposited using a chemical vapor deposition (CVD) process, an atomic layer deposition (ALD) process, a thermal oxidation process, a physical vapor deposition (PVD) process, another applicable process, or a combination thereof. The gate electrode 46 for PMOS-FET may be made of a p-type metal with a work function ranging from about 4.5 eV to about 5.2 eV, which may be a single metal or a compound metal. The gate electrode 46 for NMOSFET may be made of an n-type metal with a work function ranging from about 3.9 eV to about 4.5 eV, which may be a single metal or a compound metal. Many variations and/or modifications can be made to embodiments of the disclosure.

Figure 5:
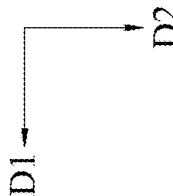
FIG. 5 illustrates a diagrammatic top view of the semiconductor structure in accordance with some embodiments of the present disclosure.
Figure 6:
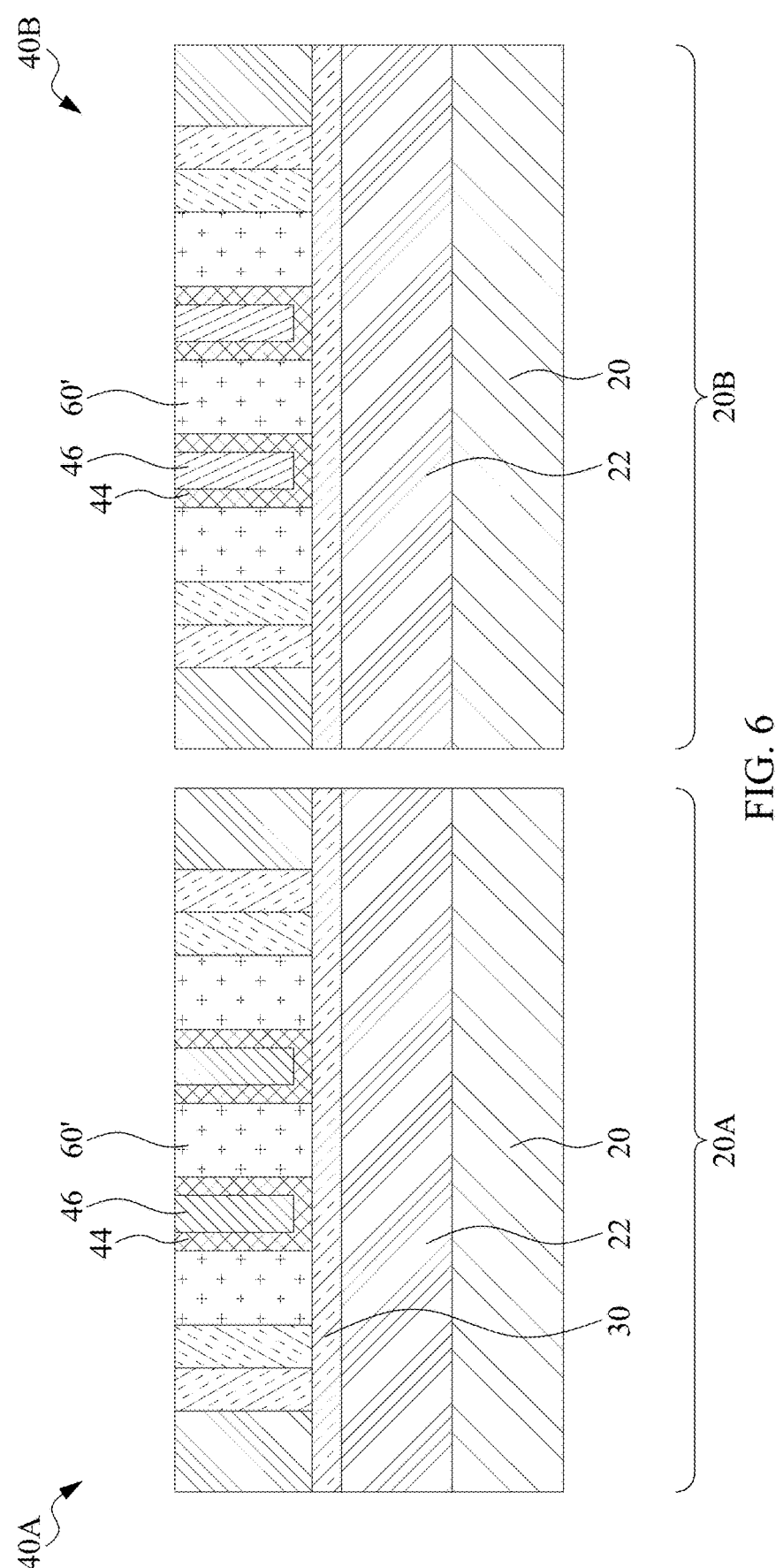
FIG. 6 illustrates a diagrammatic cross-sections $X_1$-$X_1$' and $X_2$-$X_2$' shown in FIG. 5 in accordance with some embodiments of the present disclosure.
Figure 7:
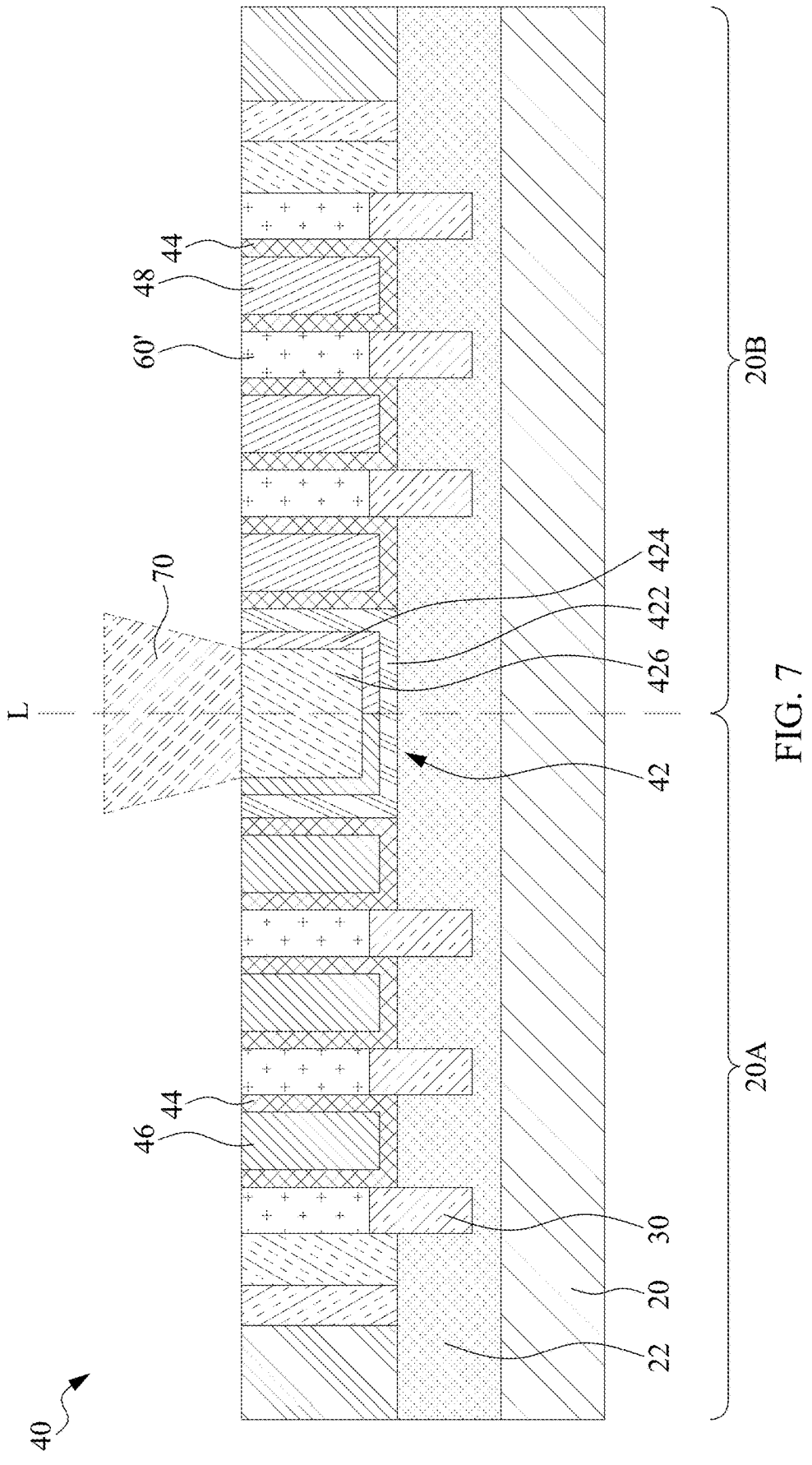
FIG. 7 illustrates a diagrammatic cross-section Y-Y' shown in FIG. 5 in accordance with some embodiments of the present disclosure.

FIGS. 5 to 7 illustrate the dummy pillars 60' in accordance with some embodiments, in which FIG. 6 depicts cross-sections $X_1$-$X_1$' and $X_2$-$X_2$' shown in FIG. 5 and FIG. 7 depicts a cross-section Y-Y' shown in FIG. 5. The dummy pillars 60' are formed in the gate stacks 40 and on the fin features 30. A top of each dummy pillar 60' may be coplanar with the top of the gate stacks 40. As shown in FIG. 5, the dummy pillars 60' may be formed on the fin features 30 in the first gate region 40A and the second gate region 40B of the gate stack 40. The dummy pillars 60 are also formed in the central region 42 and in an outermost edges of the gate stack 40 along the first direction D1. In some embodiments, the depth of each fin feature 30 exposed from the STI layer 22 (from the STI layer 22 to top of the fin feature 20) is greater than the depth of the dummy pillar 60' (from the bottom of the dummy pillar 60' to the top of the dummy pillar 60'). In some embodiments, the depth of each fin feature 30 exposed from the STI layer 22 is about 10% to about 40% greater than the depth of the dummy pillar 60'. In some embodiments, the depth of each fin feature 30 exposed from the STI layer 22 (from the STI layer 22 to top of the fin feature 20) is equal than the depth of the dummy pillar 60' (from the bottom of the dummy pillar 60' to the top of the dummy pillar 60'). In some embodiments, the depth of each fin feature 30 exposed from the STI layer 22 (from the STI layer 22 to top of the fin feature 20) is less than the depth of the dummy pillar 60' (from the bottom of the dummy pillar 60' to the top of the dummy pillar 60'). In some embodiments, the depth of each fin feature 30 exposed from the STI layer 22 is about 10% to about 70% less than the depth of the dummy pillar 60'.

As shown in FIGS. 6 and 7, the gate stack 40 comprises a gate dielectric 44 and a gate electrode 46. The gate dielectric 44 is formed on the STI layer 22 and along sidewalls of the fin feature 30 and also along sidewalls of the dummy pillars 60'. The gate electrode 46 may be formed in the gate dielectric 44 to expose a top of the gate electrode 46. The materials for the gate dielectric 44 and the gate electrode 46 are those mentioned above.

Figure 8A:
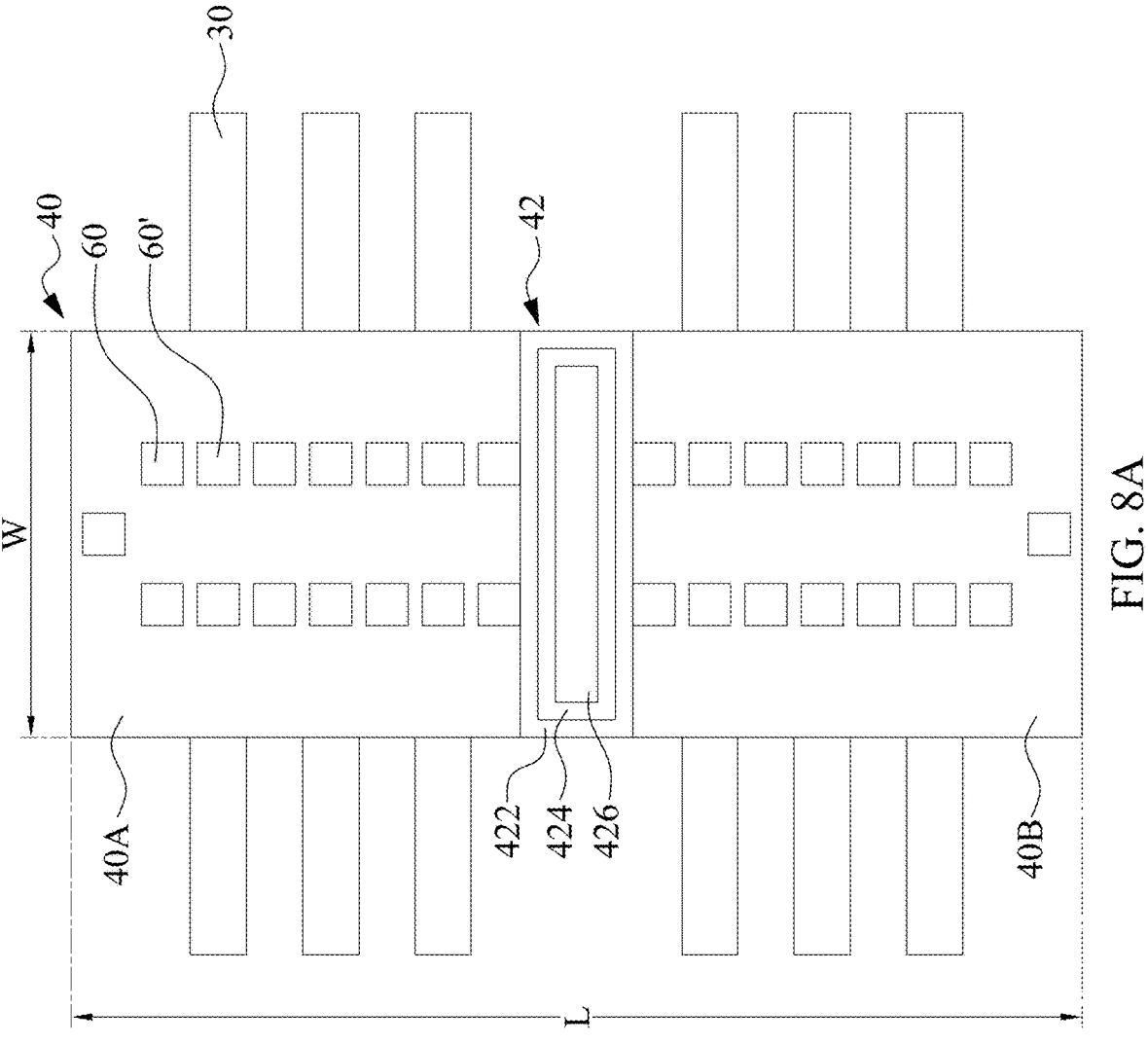
FIGS. 8A and 8B illustrates diagrammatic top views of the semiconductor structure in accordance with some embodiments of the present disclosure.
Figure 8B:
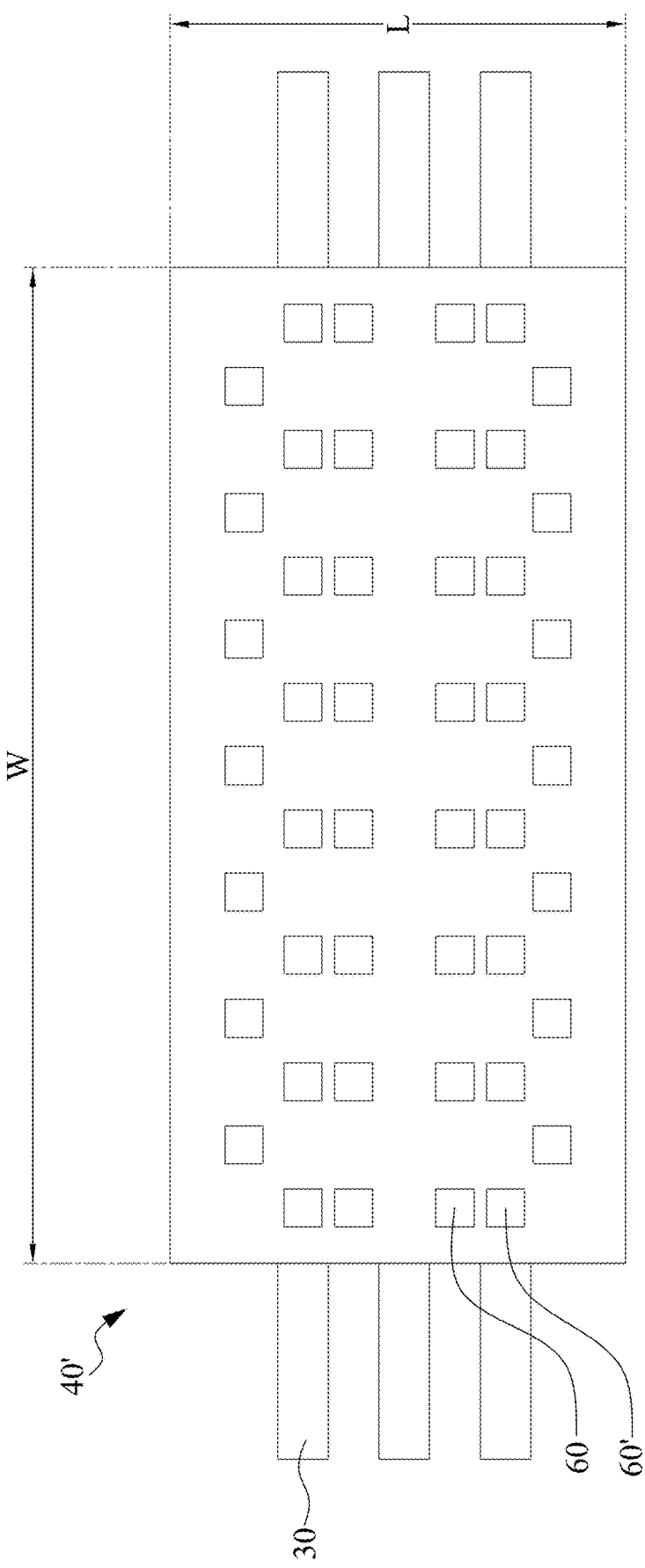

As shown in FIGS. 8A and 8B, the dummy pillars 60 and 60' are formed in the gate stacks 40, in which the dummy pillars 60 are formed on the STI layer 22 between the fin features 30, and the dummy pillars 60' are formed on the fin features 30. The top of the dummy pillars 60 and the top of the dummy pillars 60' are coplanar with the gate stack 40. In some embodiments, as shown in FIG. 8A, the width (W) of the gate stack 40 extending along the direction D1 may be shorter than the length (L) of the gate stack 40 extending along the direction D2. For example, the width may be about 0.6 μm or more and the length may be about 5 μm or more. In some embodiments, as shown in FIG. 8B, the width of the gate stack 40' (W) extending along the direction D1 may be longer than the length of the gate stack 40' (L) extending along the direction D2. For example, the width may be about 5 μm or more and the length may be about 0.6 μm or more.

Figure 9:
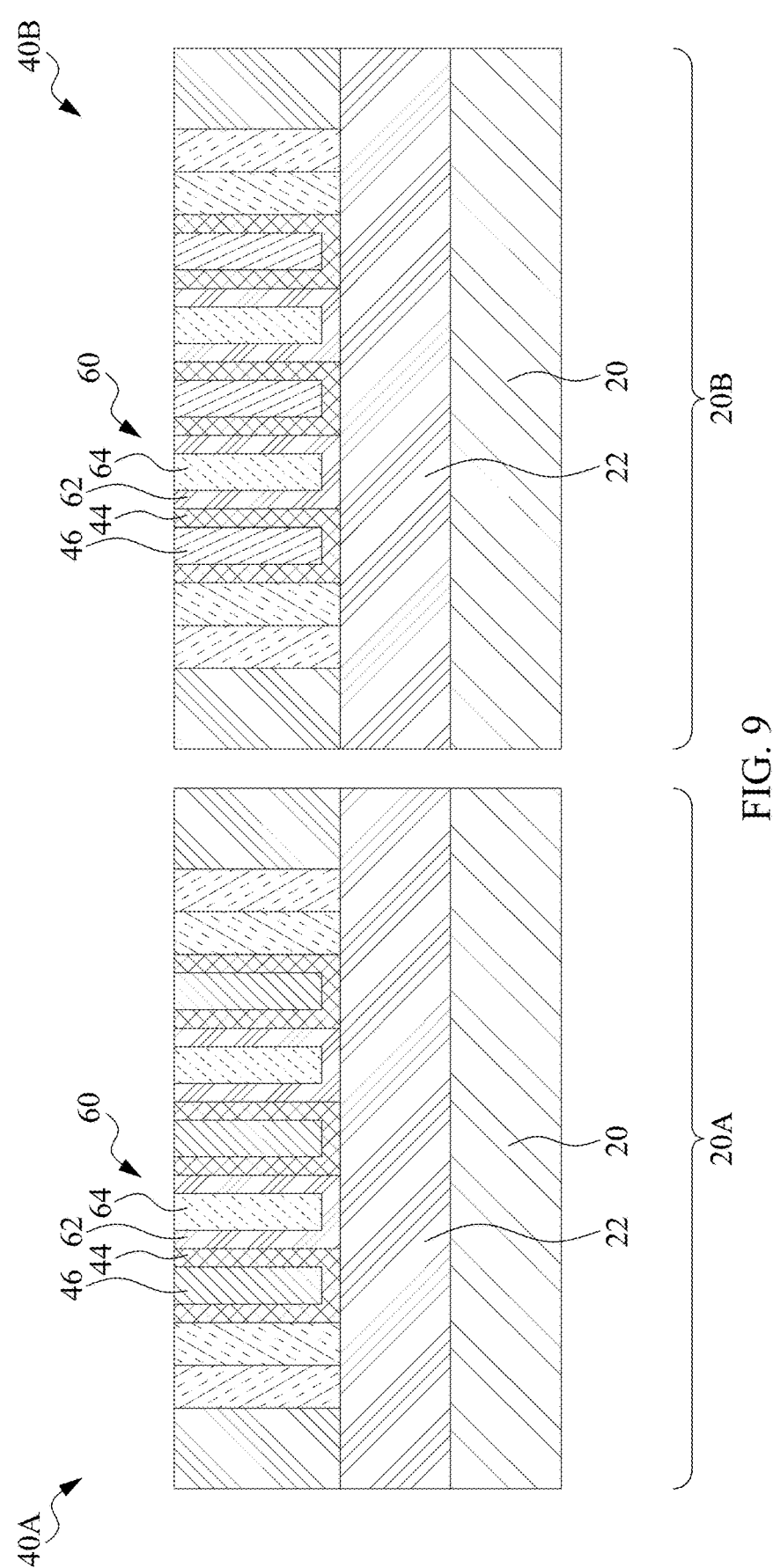
FIGS. 9 and 10 illustrate diagrammatic cross-section side views of a semiconductor structure in accordance with some embodiments of the present disclosure.
Figure 10:
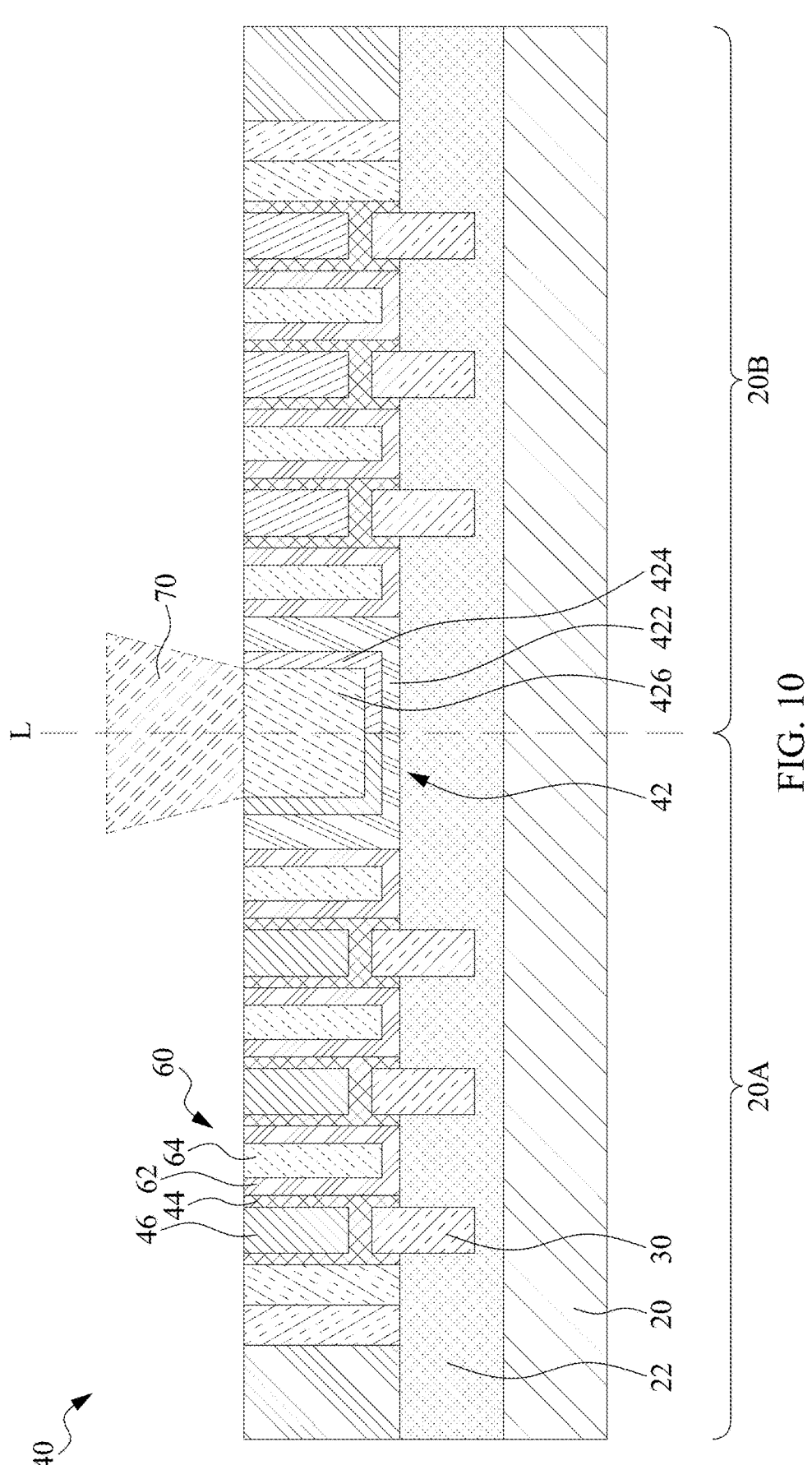

In some embodiments, the dummy pillars 60, 60' may be made of a single material, which includes, but not limited to dielectric materials (such as SiN, polyoxide, SiC and the like), metal materials (such as TiN, Co, W, Al and so on), metal oxides (such as AlO, ZrO and so on). In some alternative embodiments, the dummy pillars 60, 60' are made of a hybrid material. For example, as shown in FIGS. 9 and 10, the dummy pillars 60 comprises a sheath layer 62 formed on the STI layer 22 and abutting the gate stacks 40, and a core layer 64 surrounded by the sheath layer 62 to expose a top of the core layer 64. In some embodiments, the dummy pillars 60' comprises a sheath layer formed on one of the fin features 30 and abutting the gate stacks 40, and a core layer surrounded by the sheath layer to expose a top of the core layer 64. The sheath layer 62 may include nitrides (such as SiN) and the core layer 64 may include oxides (such as polyoxides, metal oxides and the like). Such hybrid material can also be applied to the dummy pillars 60' formed on the fin features 30.

Figure 11A:
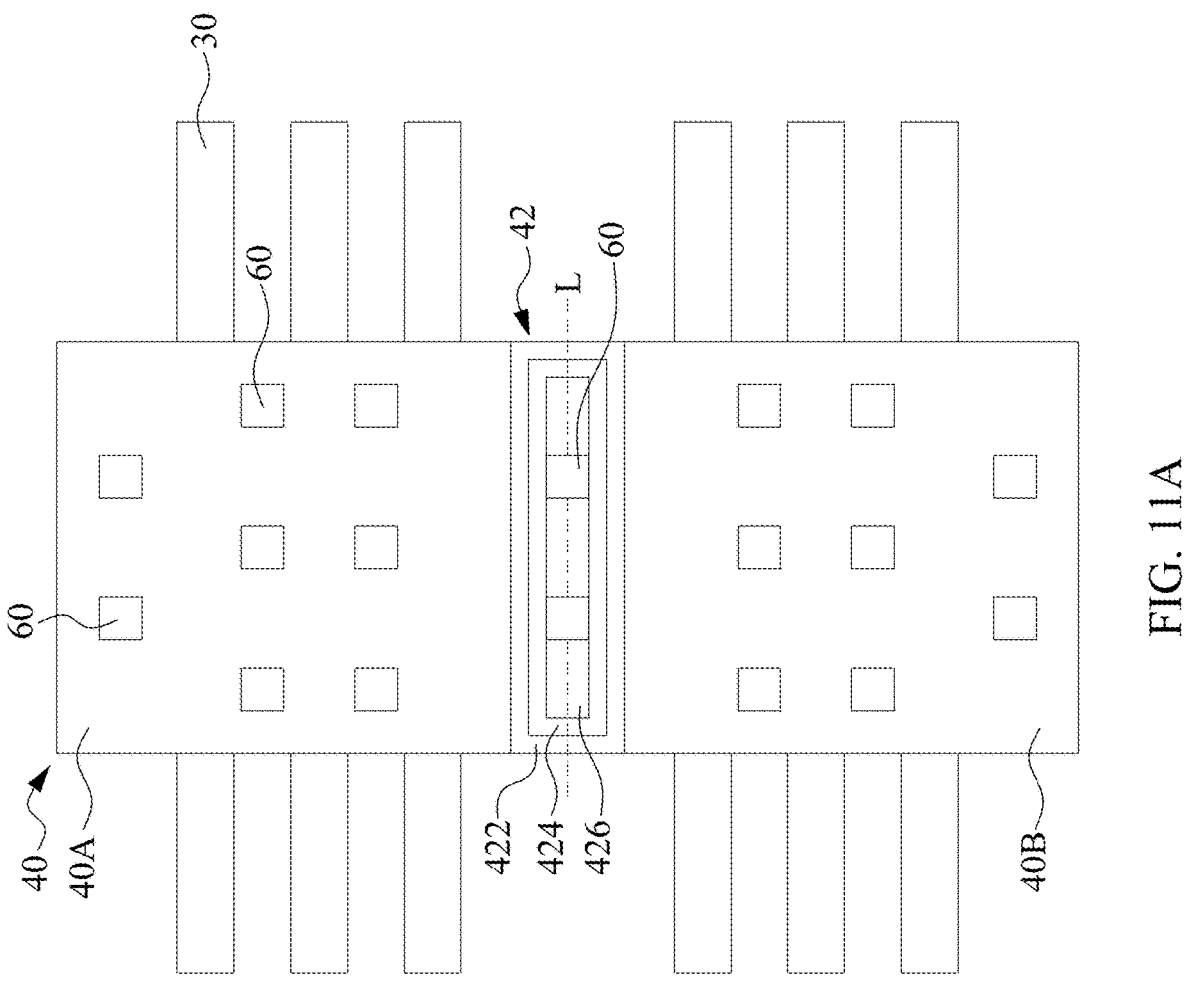
FIGS. 11A, 11B, 11C, 11D, 12A, 12B, 12C, 12D, 13A, 13B, 13C, 13D, 14A, 14B, 14C, 14D, 14E, 14F, 14G, 14H, 14I, and 14J show top views of the semiconductor structure in accordance with various embodiments of the present disclosure.
Figure 12A:
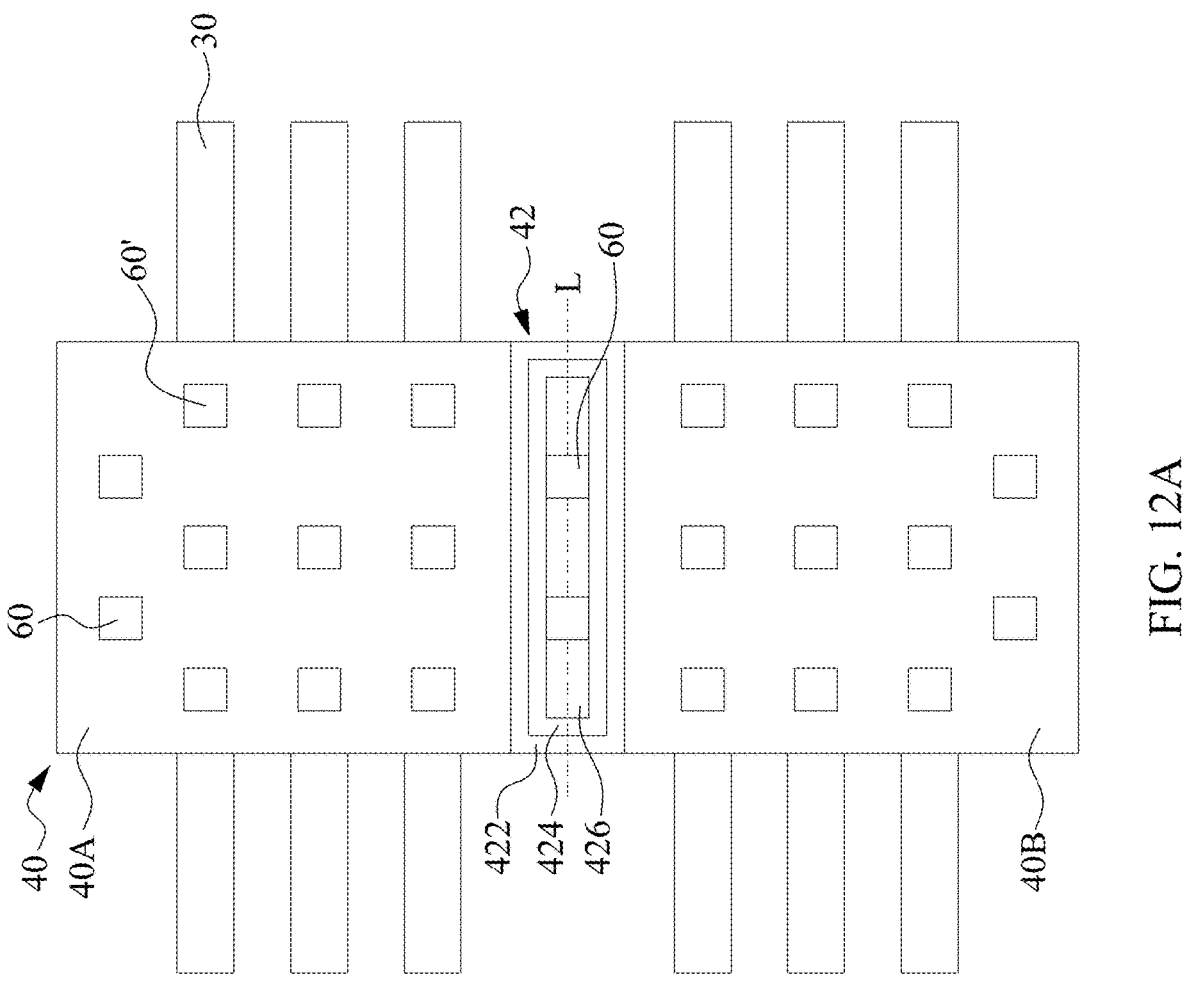

The dummy pillars 60 and 60' may be arranged in the gate stack 40 in any patterns with a variety of densities. For example, the number of each line of the dummy pillars 60 between each two of the fin features 30 may be identical (as shown in FIG. 11A); the number of each line of the dummy pillars 60' on one of the fin features 30 may be identical (as shown in FIG. 12A); and the number of the dummy pillars 60 in the central region 42 may be identical to the number of the dummy pillars 60 in each outermost edge of the gate stack 40 along the first direction D1 (as shown in both FIGS. 11A and 12A), so that the dummy pillars 60 and 60' in the first gate region 40A and the second gate region 40B may present a regular array pattern. In some embodiments, the number of each line of the dummy pillars 60 between the fin features 30 and/or the number of each line of the dummy pillars 60' on one of the fin features 30 may be different from the number of the dummy pillars 60 in each outermost edge of the gate stack 40 along the first direction D1.

As shown in FIGS. 11A and 12A, in some embodiments, the number of each line of the dummy pillars 60 between the fin features 30 and/or the number of each line of the dummy pillars 60' on one of the fin features 30 may be greater the number of the dummy pillars 60 in each outermost edge of the gate stack 40 along the first direction D1 and may be also greater than the number of the dummy pillars 60 in the central region 42.

Figure 11B:
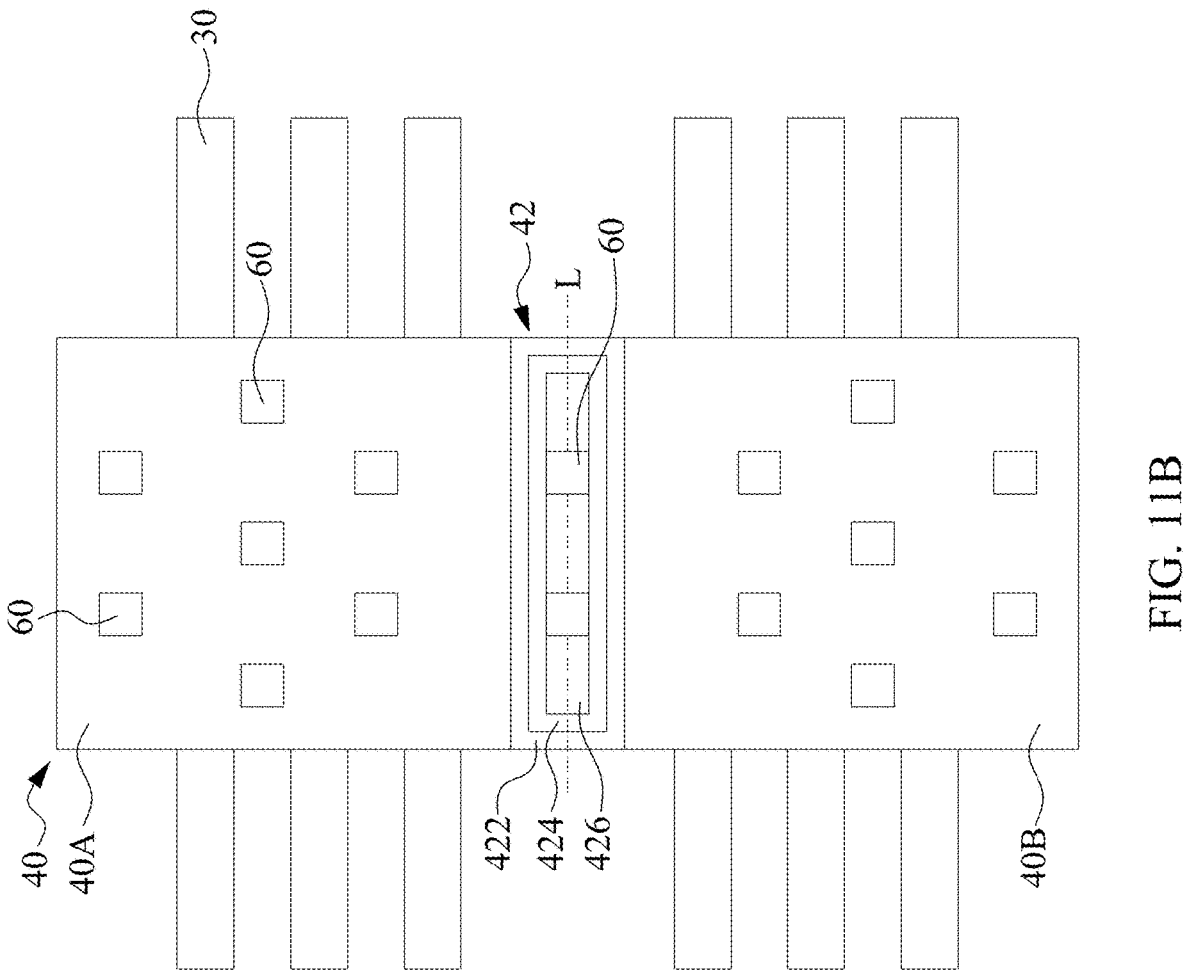
Figure 11C:
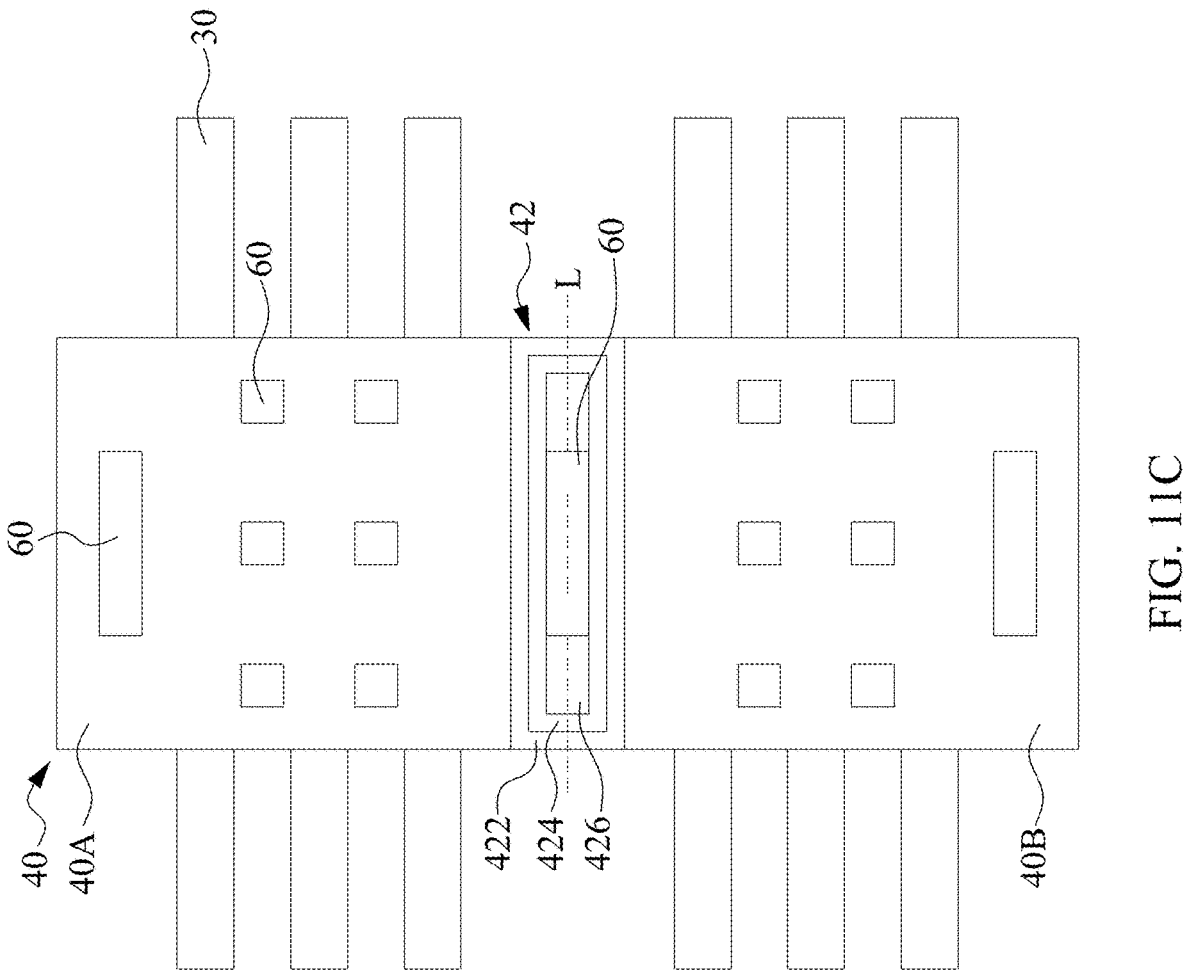
Figure 11D:
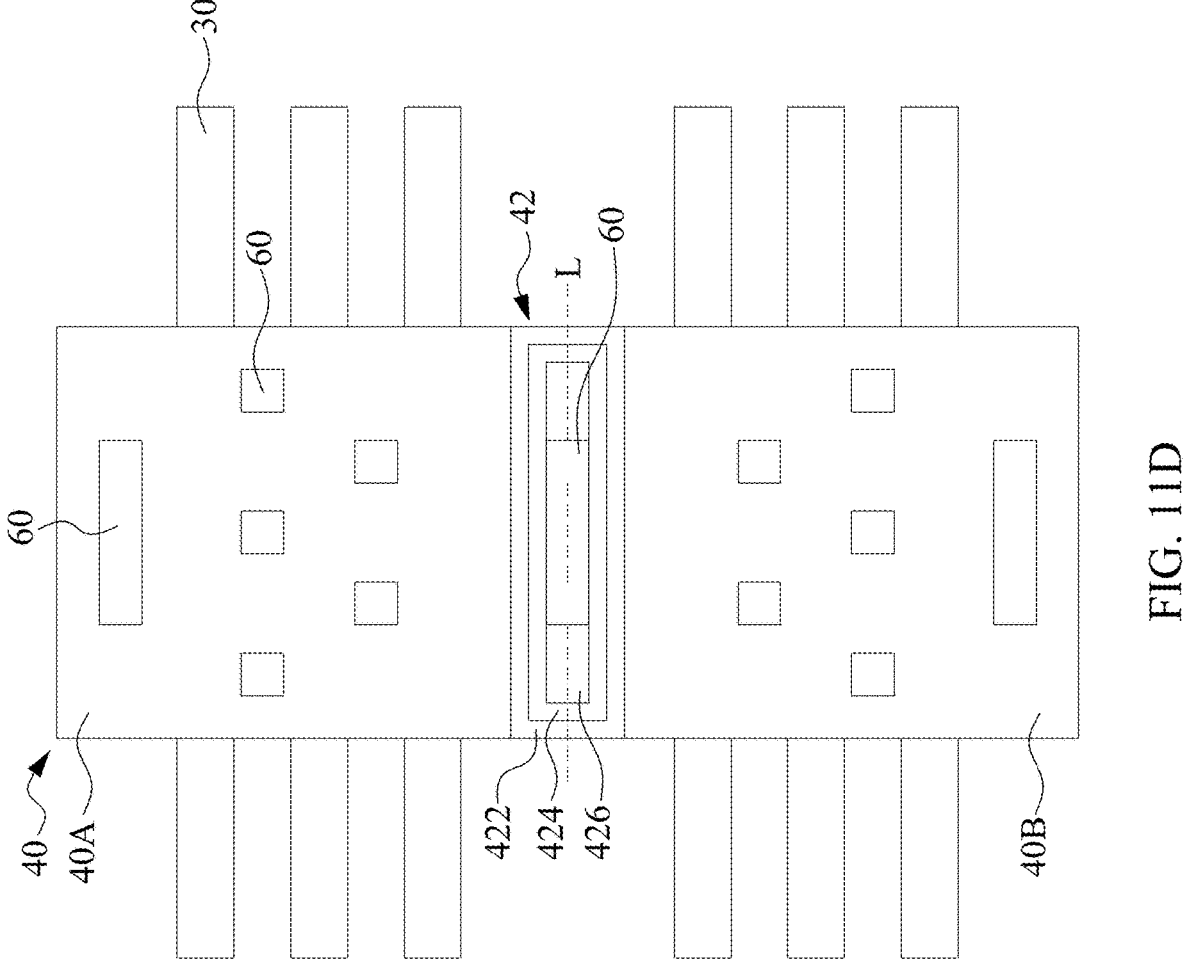
Figure 12B:
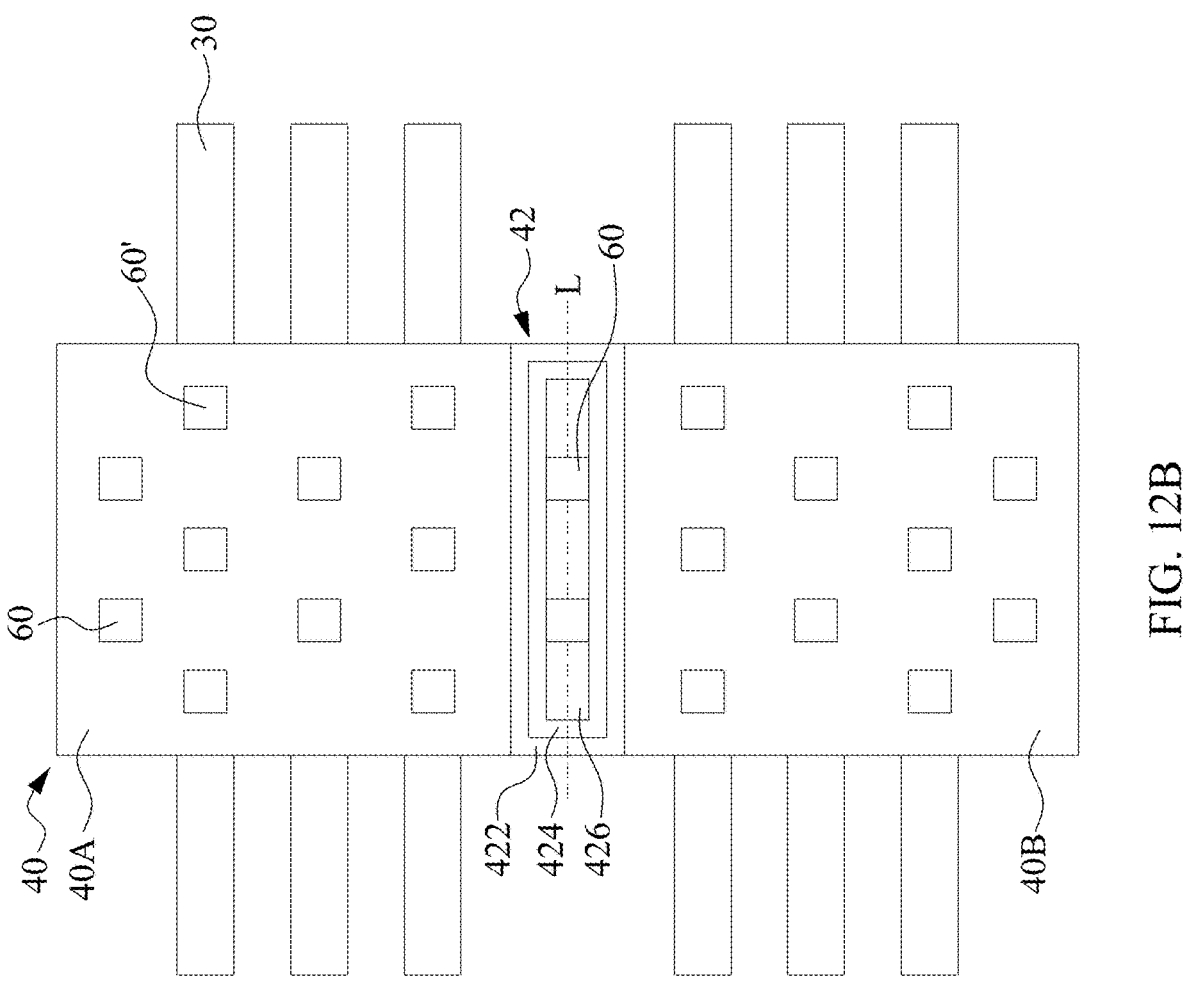
Figure 12C:
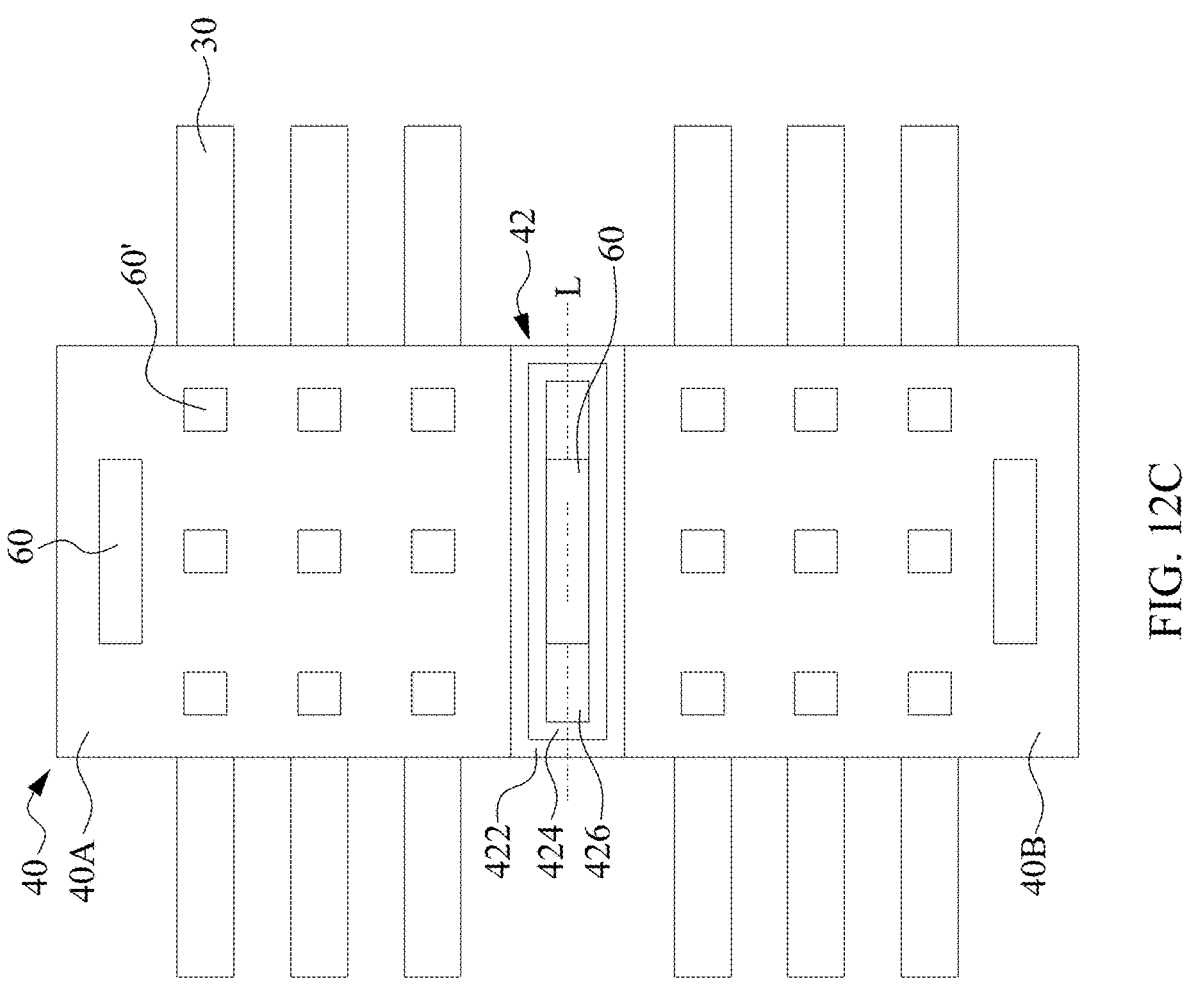
Figure 12D:
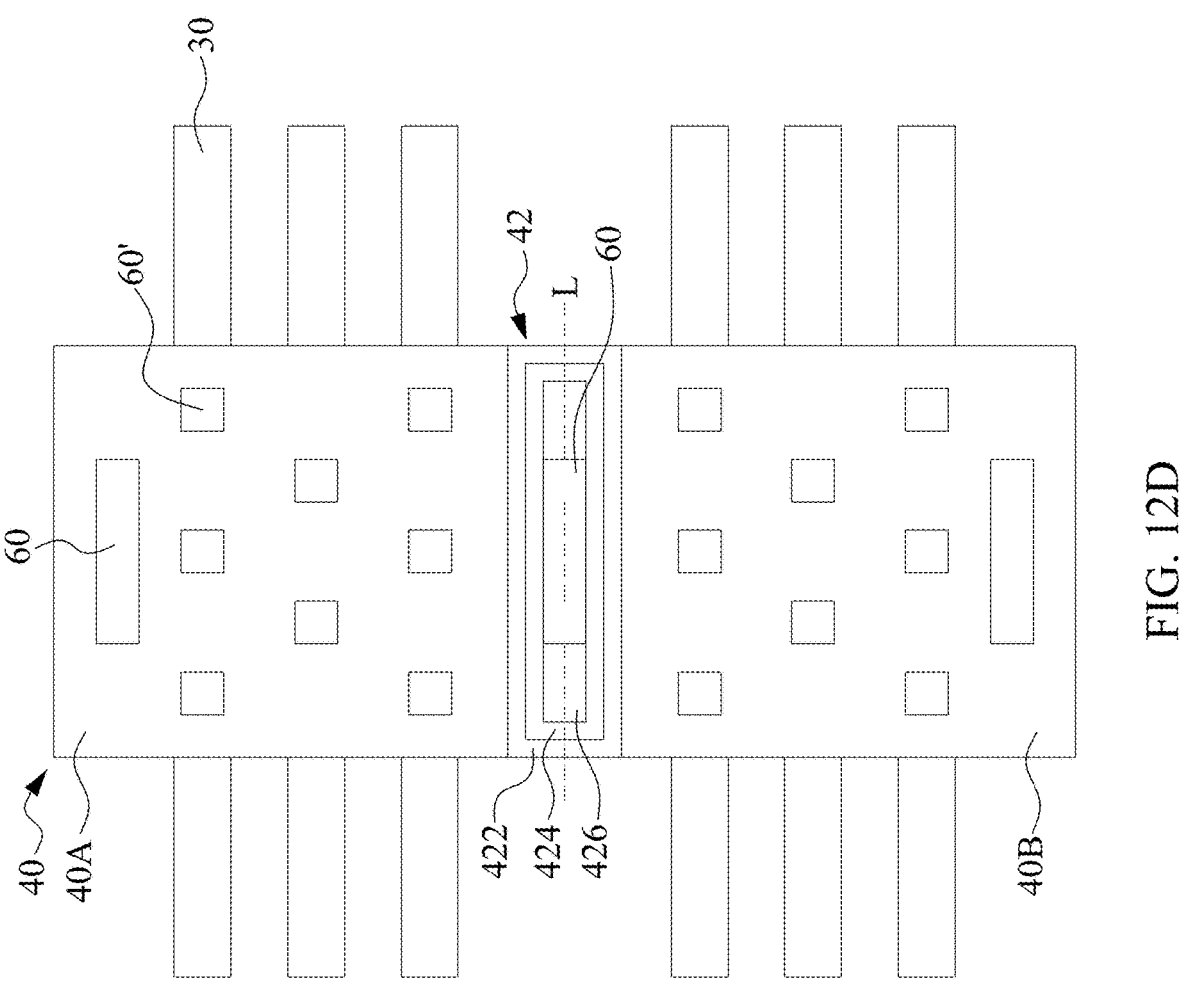
Figure 13A:
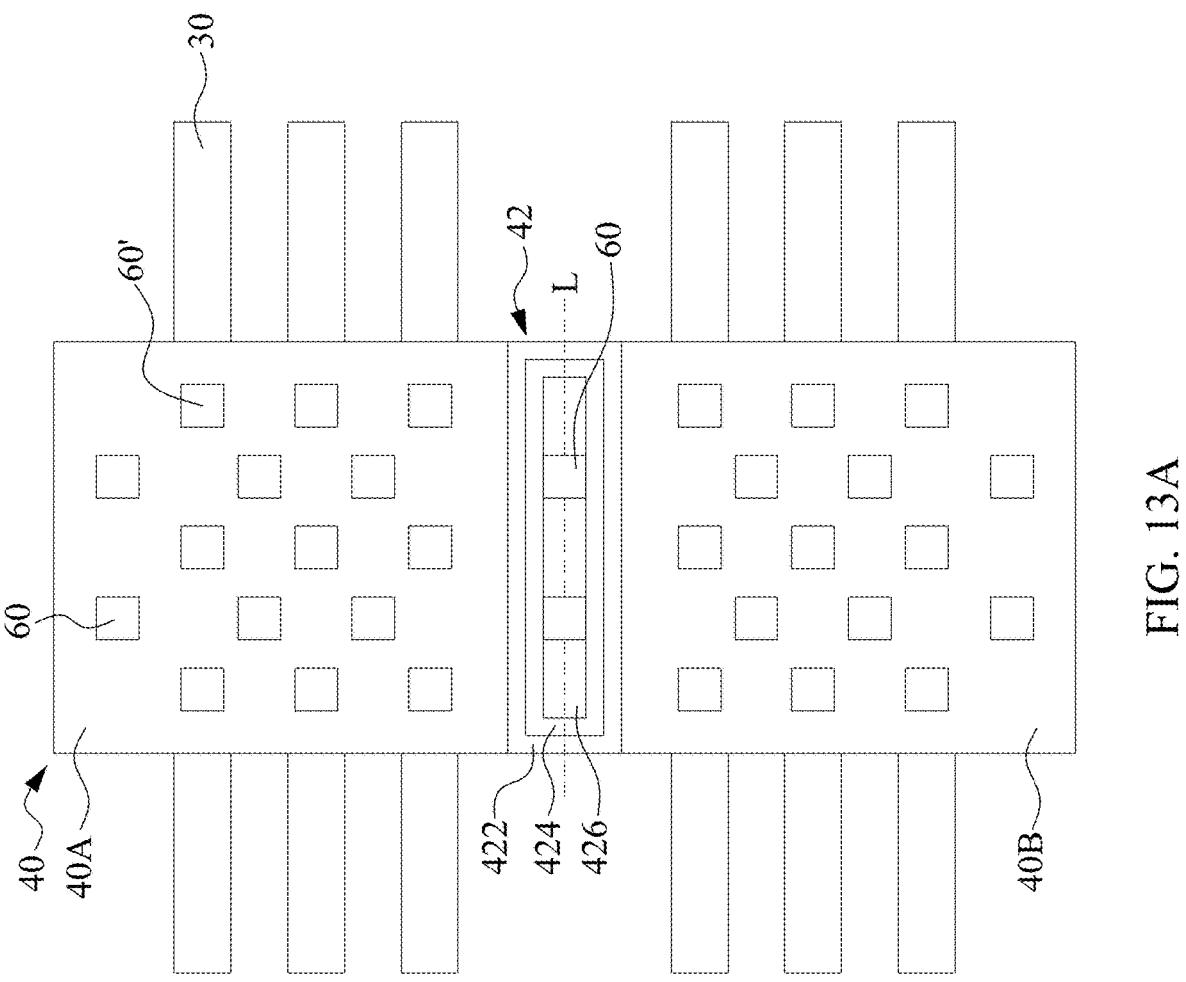
Figure 13B:
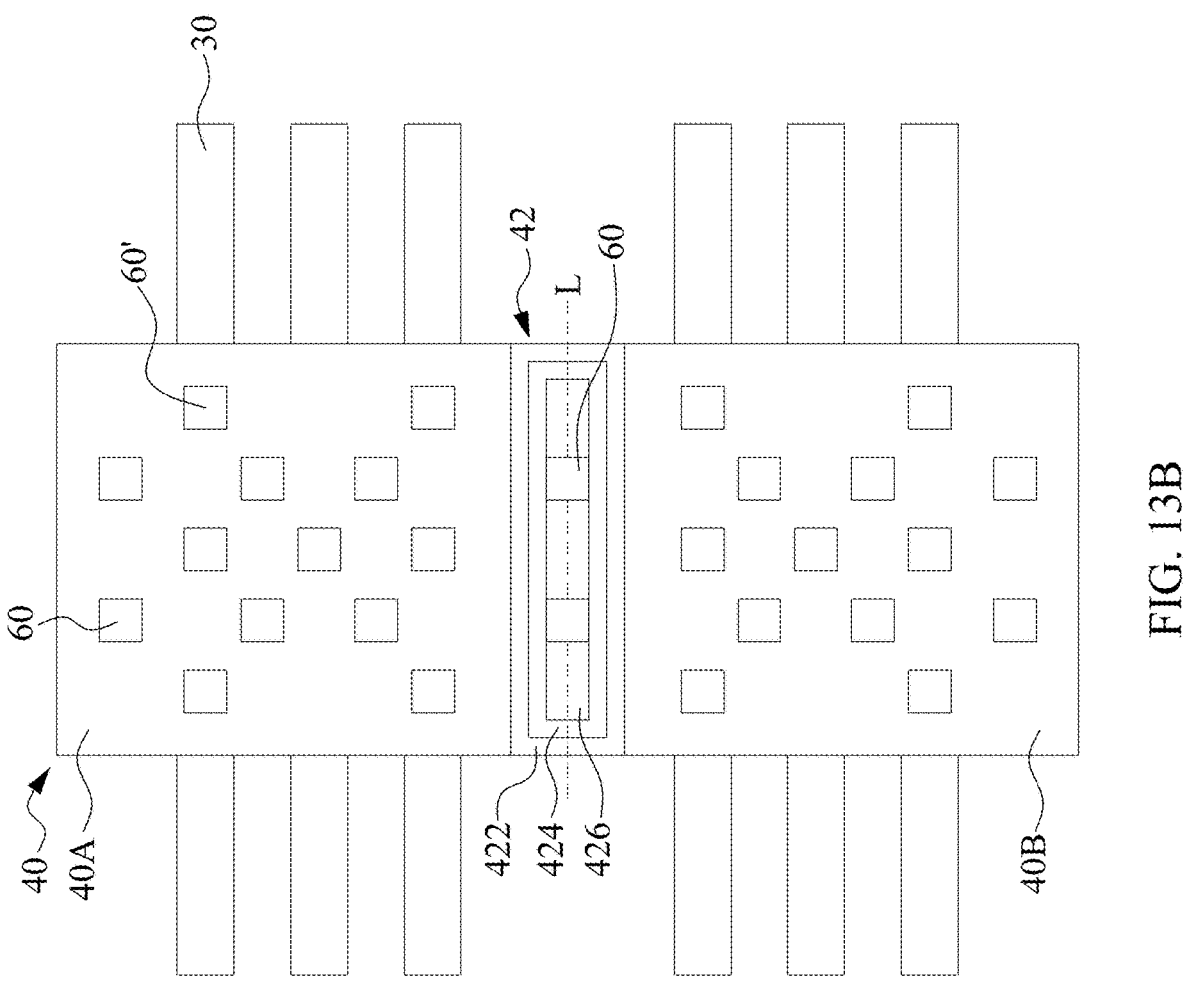
Figure 13C:
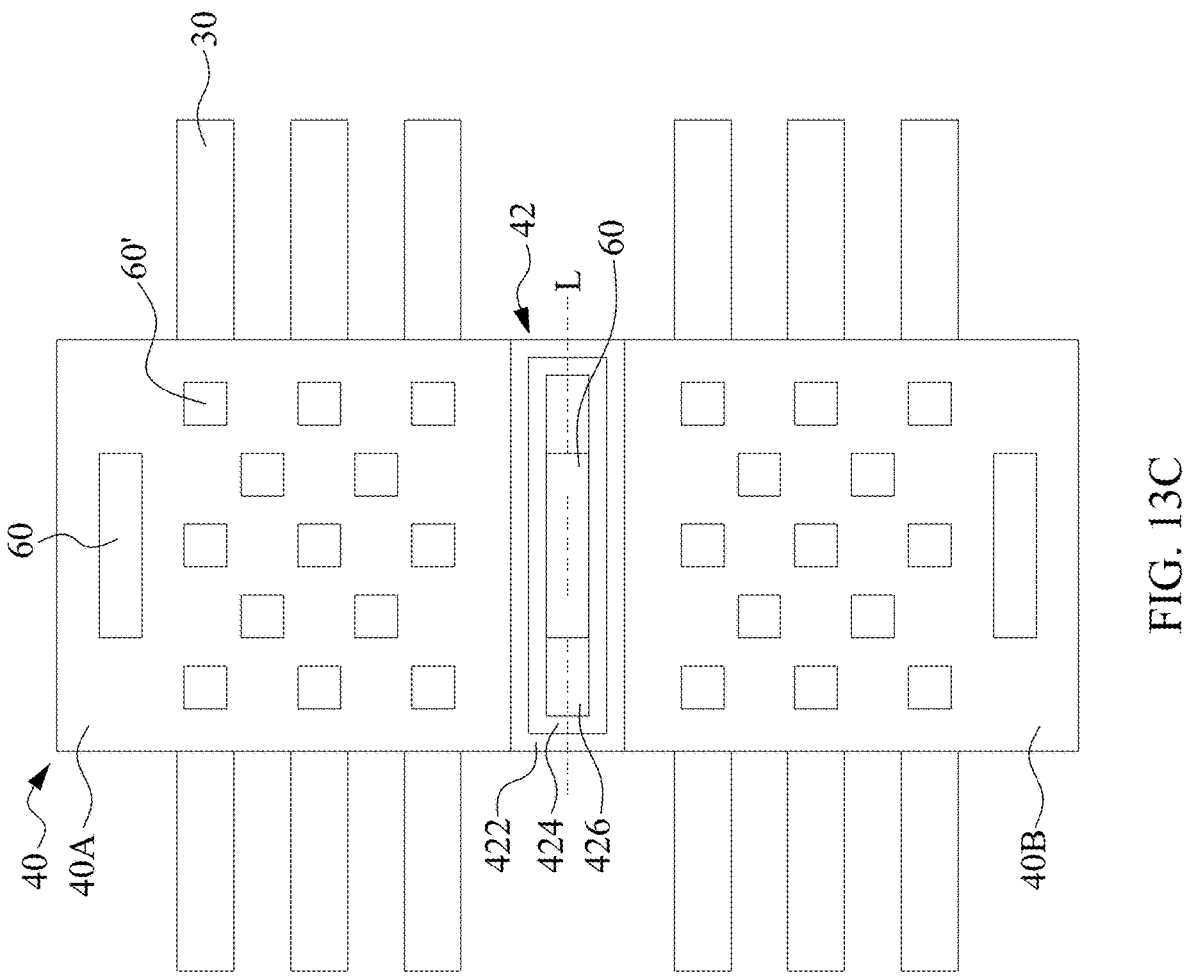
Figure 13D:
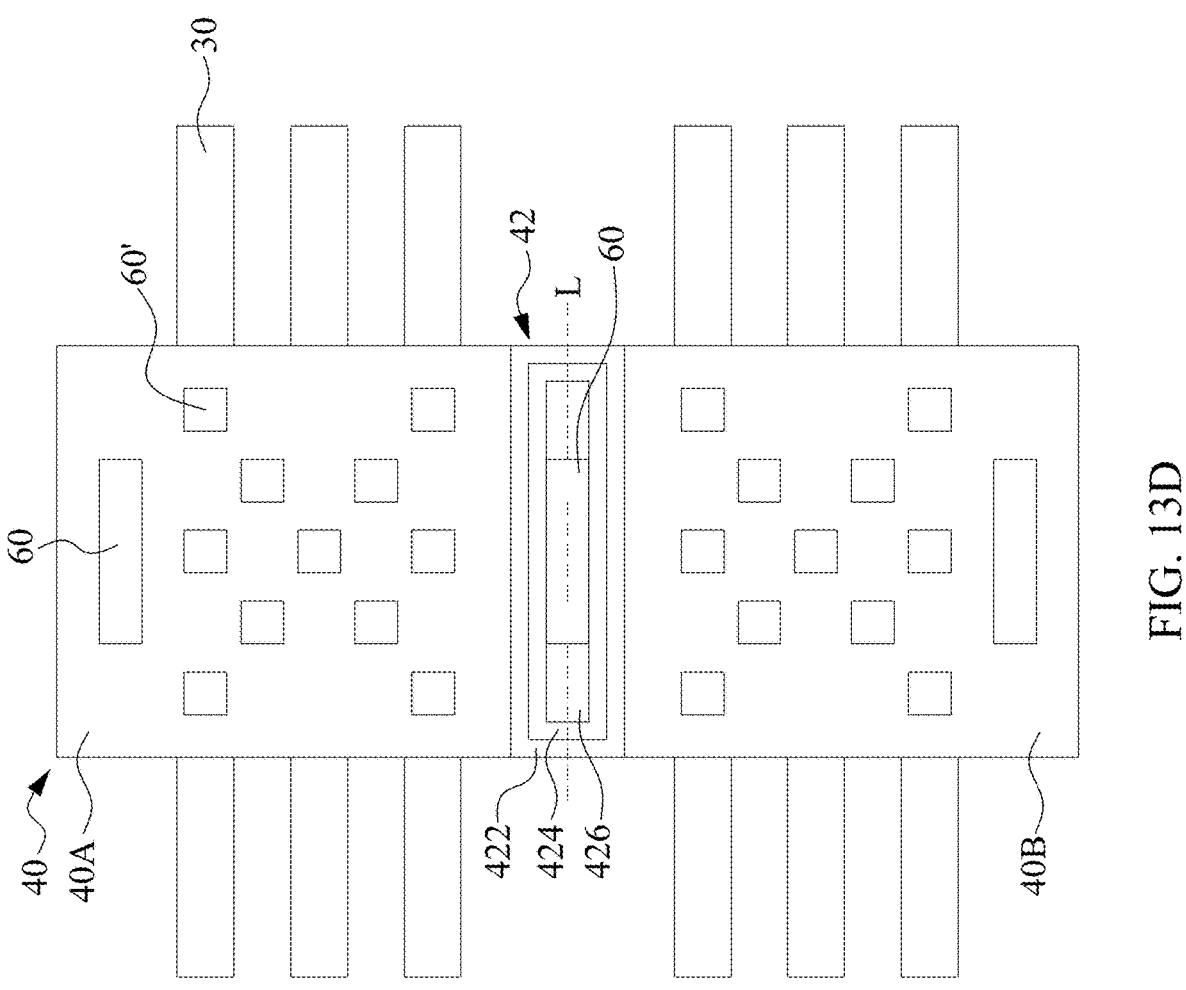

As shown in FIGS. 11B and 12B, in some alternative embodiments, the number of each line of the dummy pillars 60 between the fin features 30 and/or the number of each line of the dummy pillars 60' on one of the fin features 30 may be different, so that the dummy pillars 60 and 60' in the first gate region 40A and the second gate region 40B may present an irregular pattern (such as a staggered array).

As shown in FIGS. 11C, 11D, 12C and 12D, each of the dummy pillars 60 and 60' has cross section and the cross section of each of the dummy pillars 60 and 60' in the first gate region 40A and the second gate region 40B is different from the cross section of each of the dummy pillars 60 in the central region 42 and the outermost edges of the gate stack 40 along the first direction D1. For example, each of the dummy pillars 60 and 60' in the first gate region 40A and the second gate region 40B has a square cross section from the top view while the dummy pillars 60 formed in the central region 42 and the outermost edges of the gate stack 40 along the first direction D1 each have a rectangular cross section.

As shown in FIGS. 13A to 13D, in some embodiments, the first gate region 40A and the second gate region 40B both include the dummy pillars 60 formed between the fin features 30 and the dummy pillars 60' formed on the fin features 30. The number of each line of the dummy pillars 60 between the fin features 30 is less than the number of each line of the dummy pillars 60' on one of the fin features 30 as illustrated. In some alternative embodiments, the number of each line of the dummy pillars 60 between the fin features 30 may be greater than the number of each line of the dummy pillars 60' on one of the fin features 30.

Figure 14A:
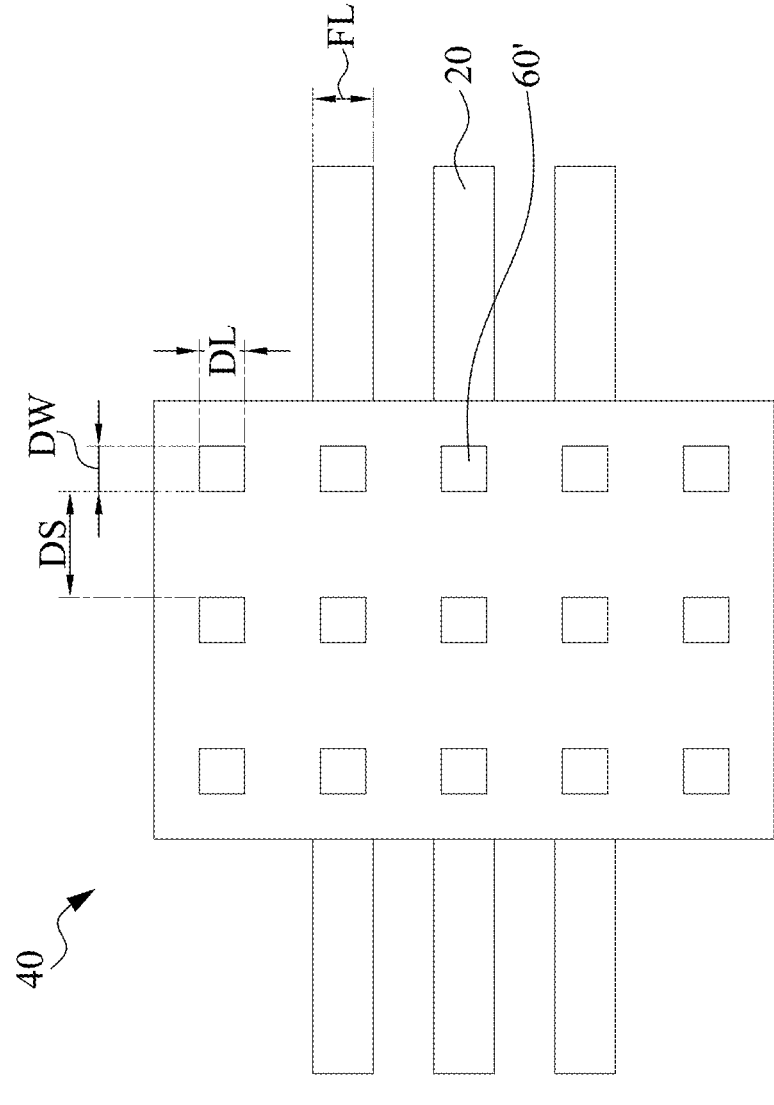
Figure 14B:
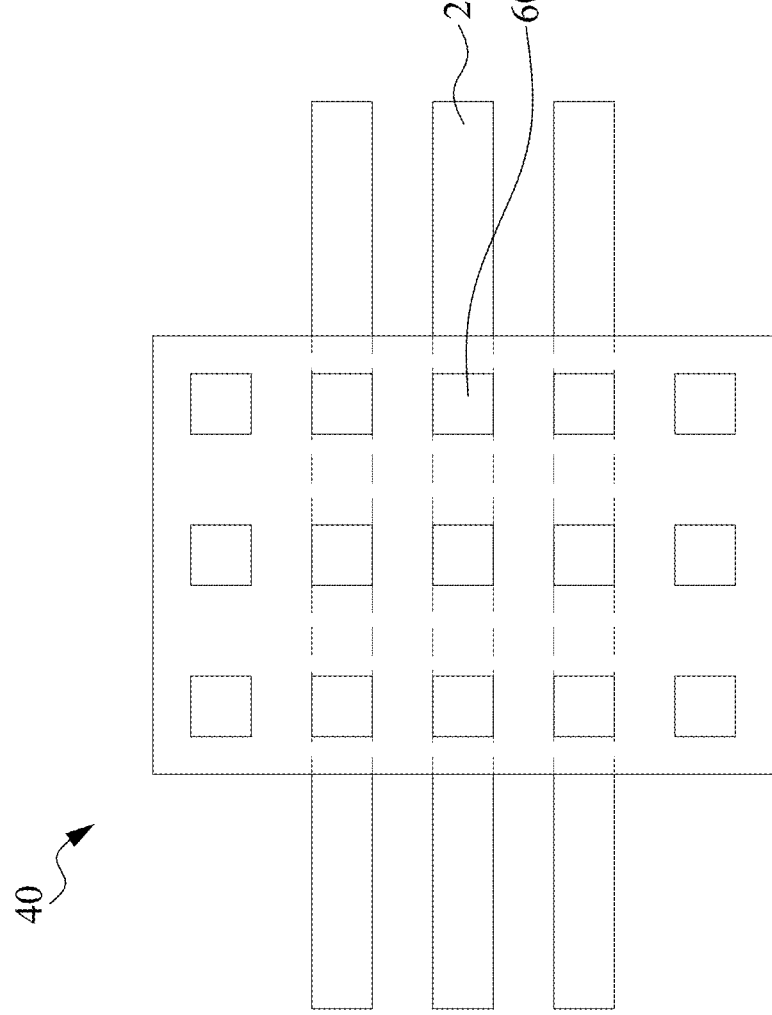
Figure 14C:
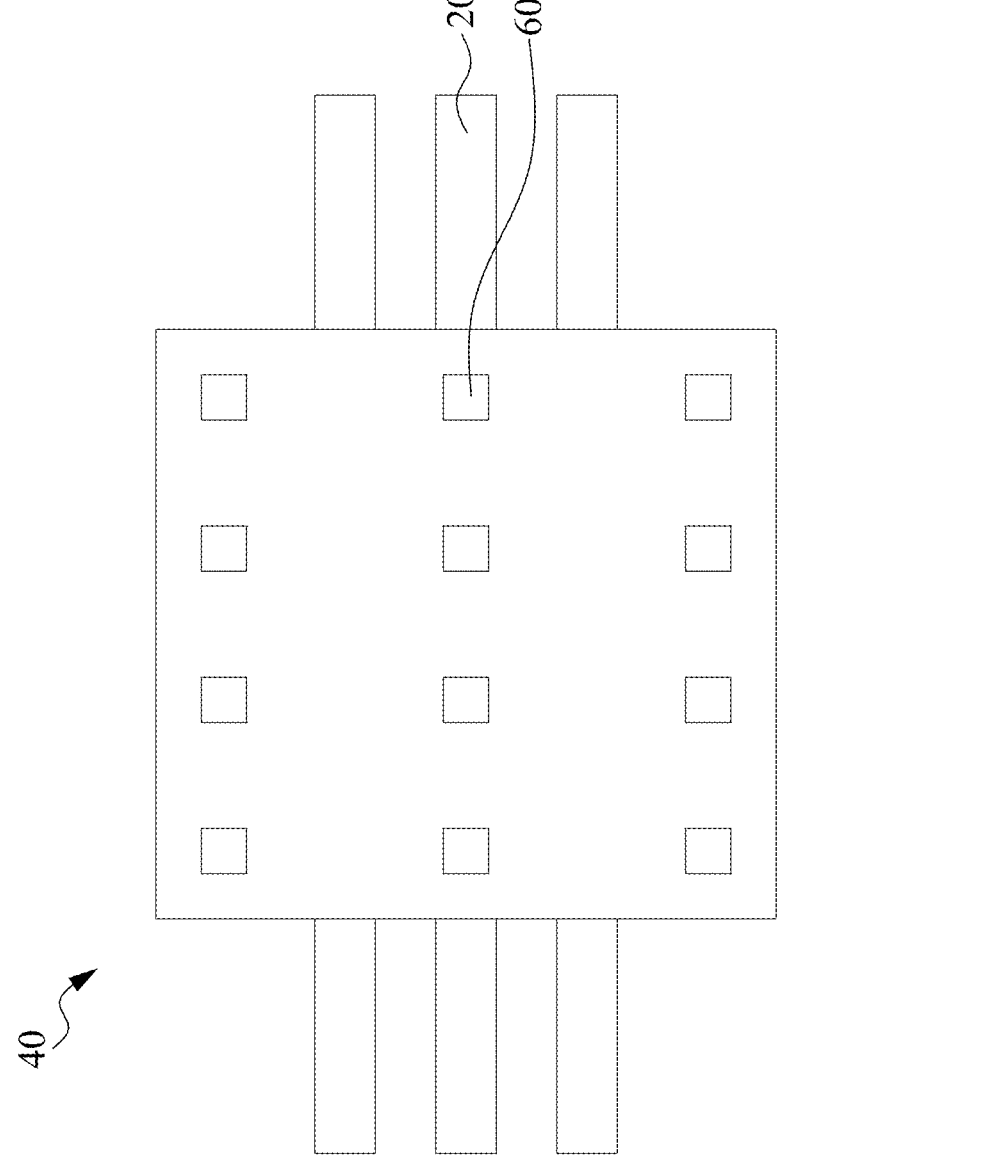

FIGS. 14A to 14J show a variety of embodiments of the dummy pillars 60 and 60'. As shown in FIGS. 14A to 14C, the number of each line of the dummy pillars 60 between the fin features 30 and/or the number of each line of the dummy pillars 60' on one of the fin features 30 may be identical to the number of the dummy pillars 60 in each outermost edge of the gate stack 40 along the first direction D1. In some embodiments, each of the dummy pillars 60 and 60' has a width (DW) along the first direction D1 and a length (DL) along the second direction D2. The DW is identical to or different from the DL. In some embodiments, the DW may be about 0.144 μm or more and the DL may be about 0.144 μm or more. A space between two dummy pillars 60 in each line of the dummy pillars 60 between the fin features 30 (DS) may be about 0.144 μm or more. A space between two dummy pillars 60' in each line of the dummy pillars 60' on one of the fin features 30 may be about 0.144 μm or more. FIG. 14A illustrates that the DL of the dummy pillars 60' is less than the length of the fin feature 30 (FL). FIG. 14B illustrates that the DL of the dummy pillars 60' is identical to the length of the fin feature 30 (FL).

In some embodiments, the dummy pillars 60 may be formed in every interval between the fin features 30 or may be merely formed in some intervals between the fin features 30. In some embodiments, the dummy pillars 60' may be formed on every fin feature 30 or may be merely formed in some fin features 30 (as shown in FIG. 14C).

Figure 14D:
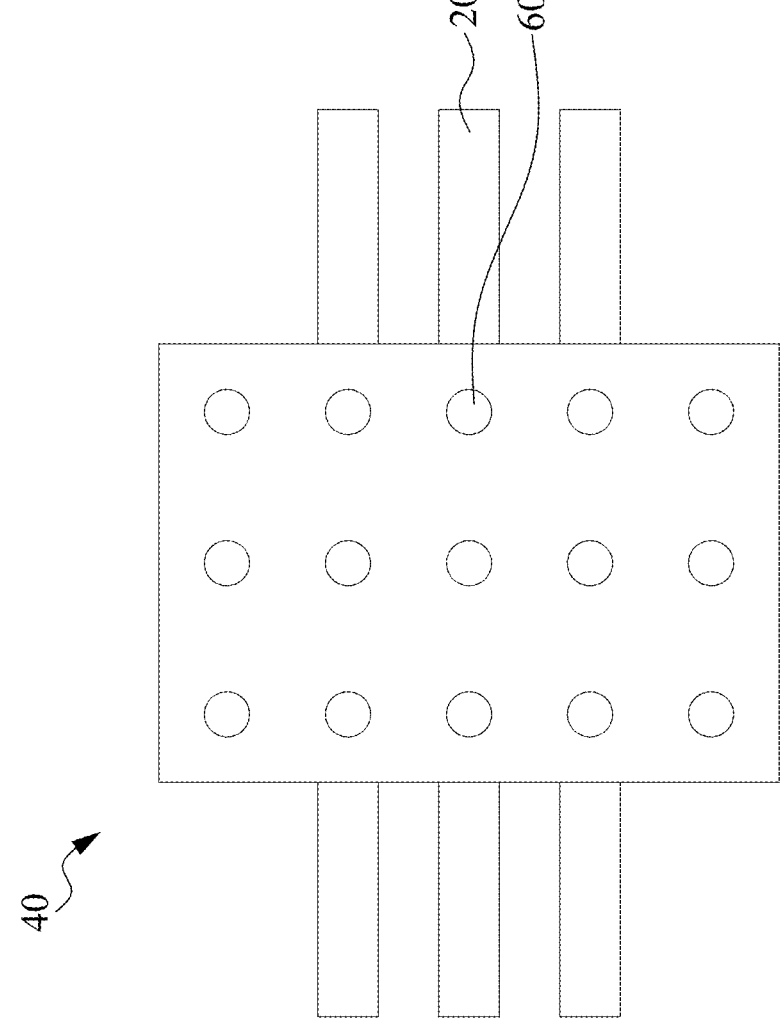
Figure 14E:
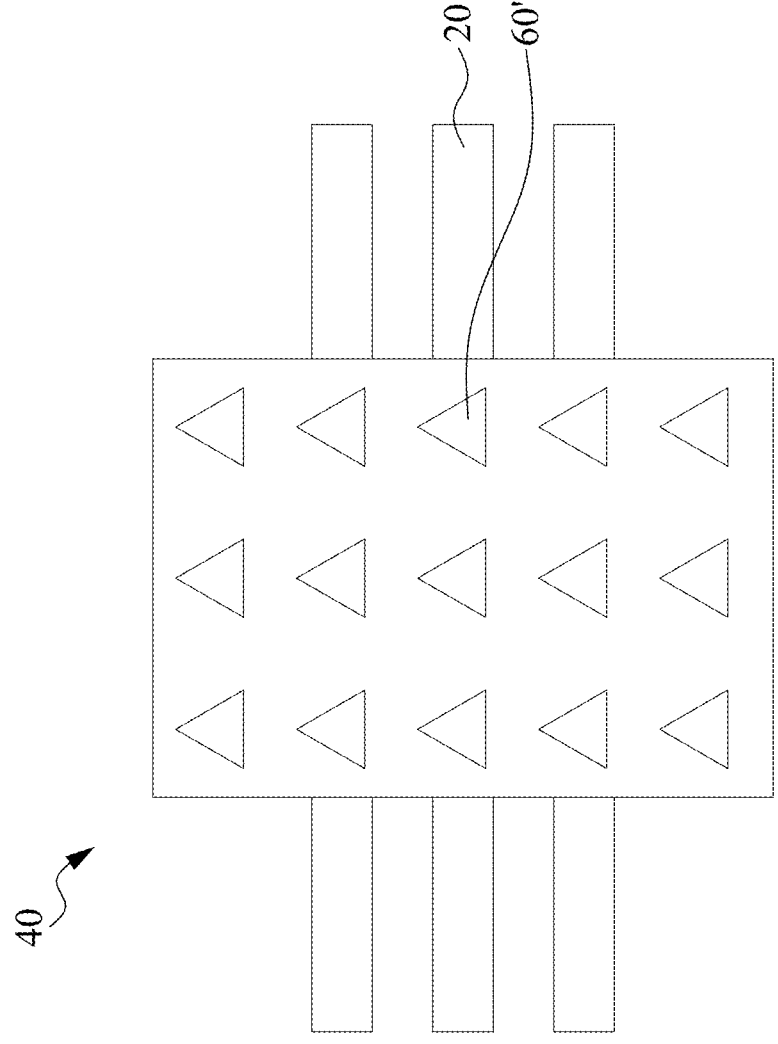
Figure 14F:
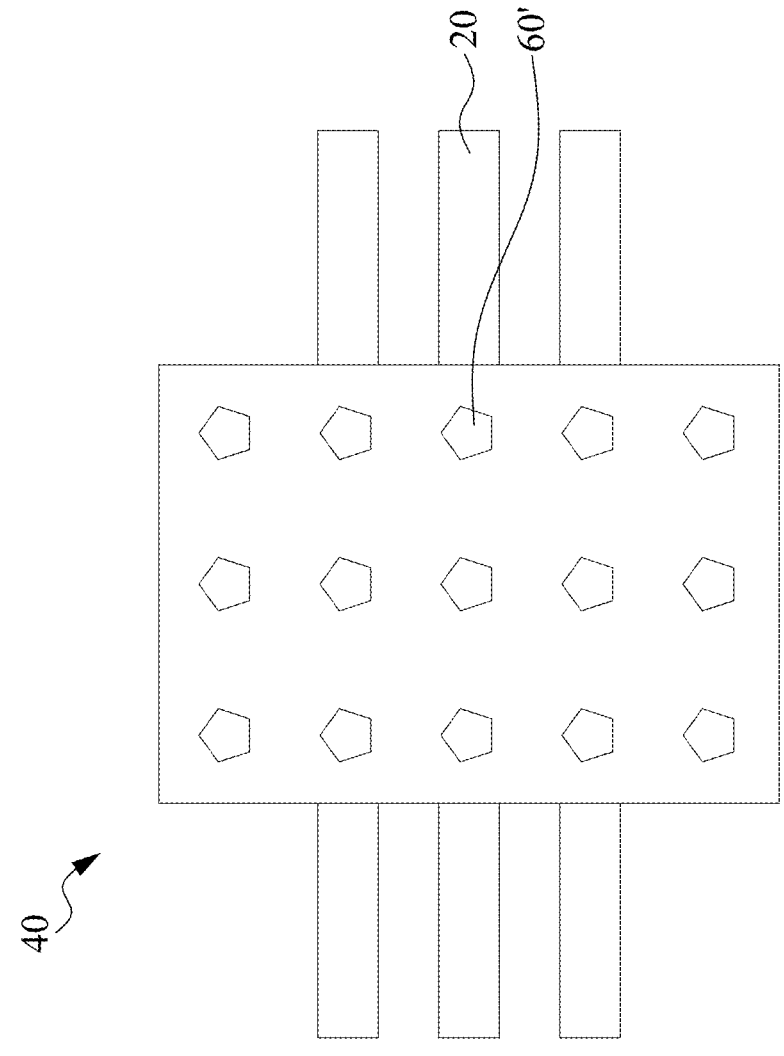
Figure 14G:
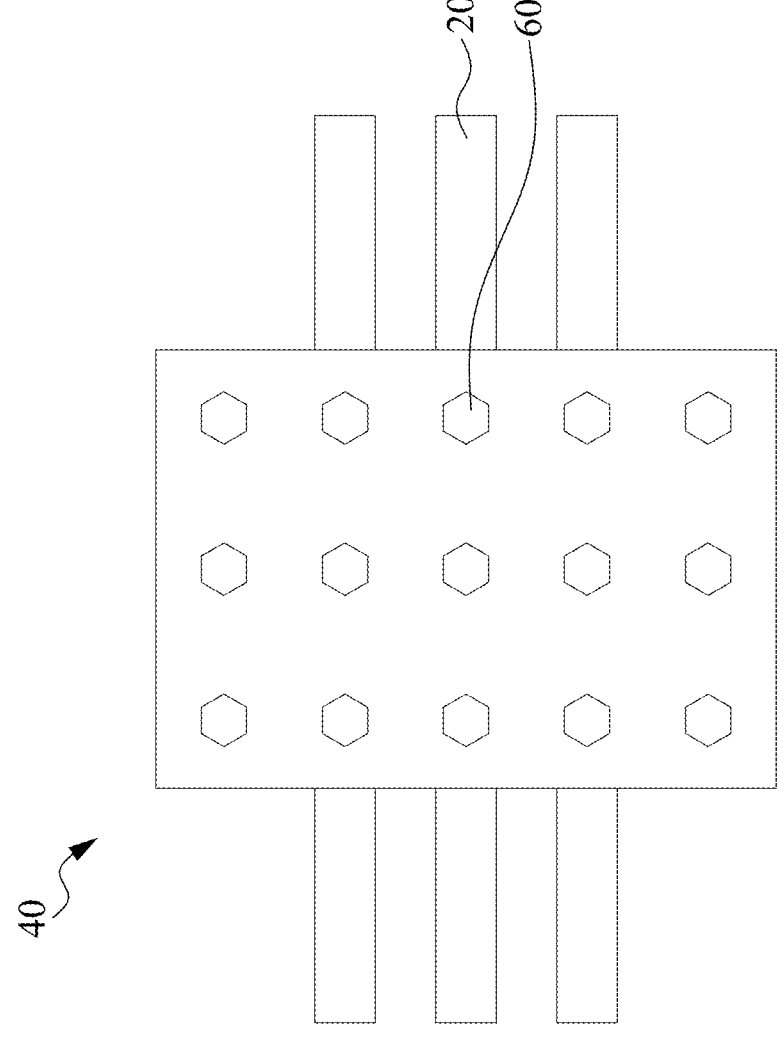

The dummy pillars 60 and 60' may have different shapes. For example, the dummy pillars 60 and 60' may have a square cross section from the top view (as shown in FIGS. 14A to 14C), a circular cross section (as shown in FIG. 14D), a triangular cross section (as shown in FIG. 14E), a polygonal cross section (such as a pentagonal cross section as shown in FIG. 14F, a hexagonal cross section as shown in FIG. 14G and so on).

Figure 14H:
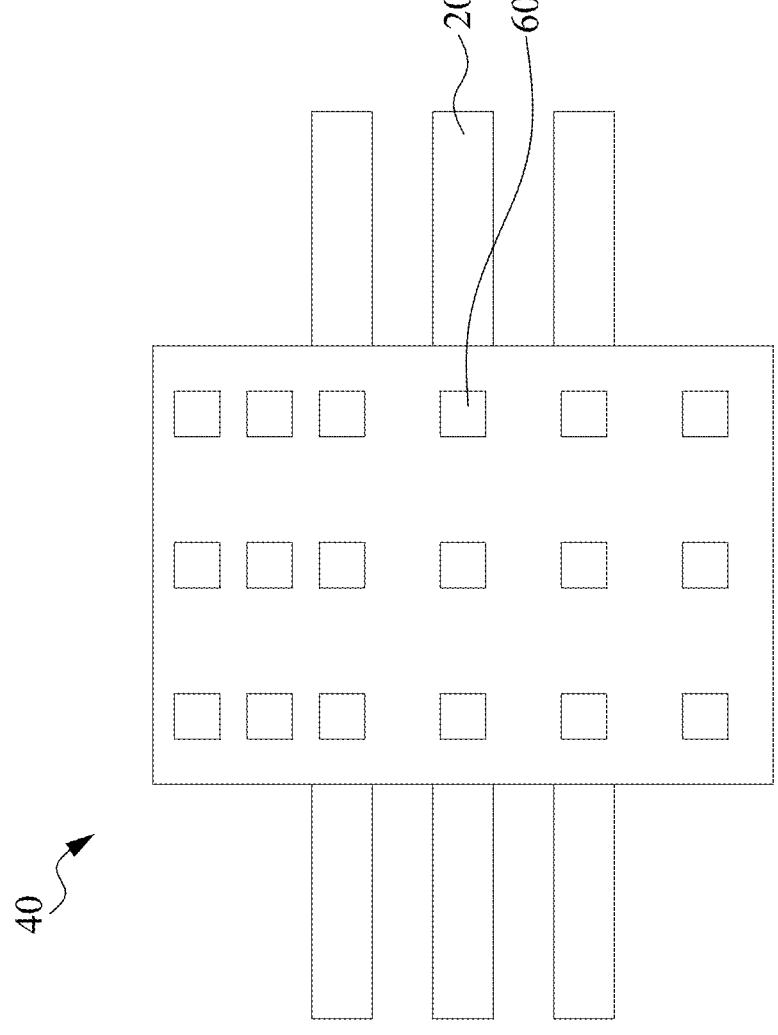
Figure 14I:
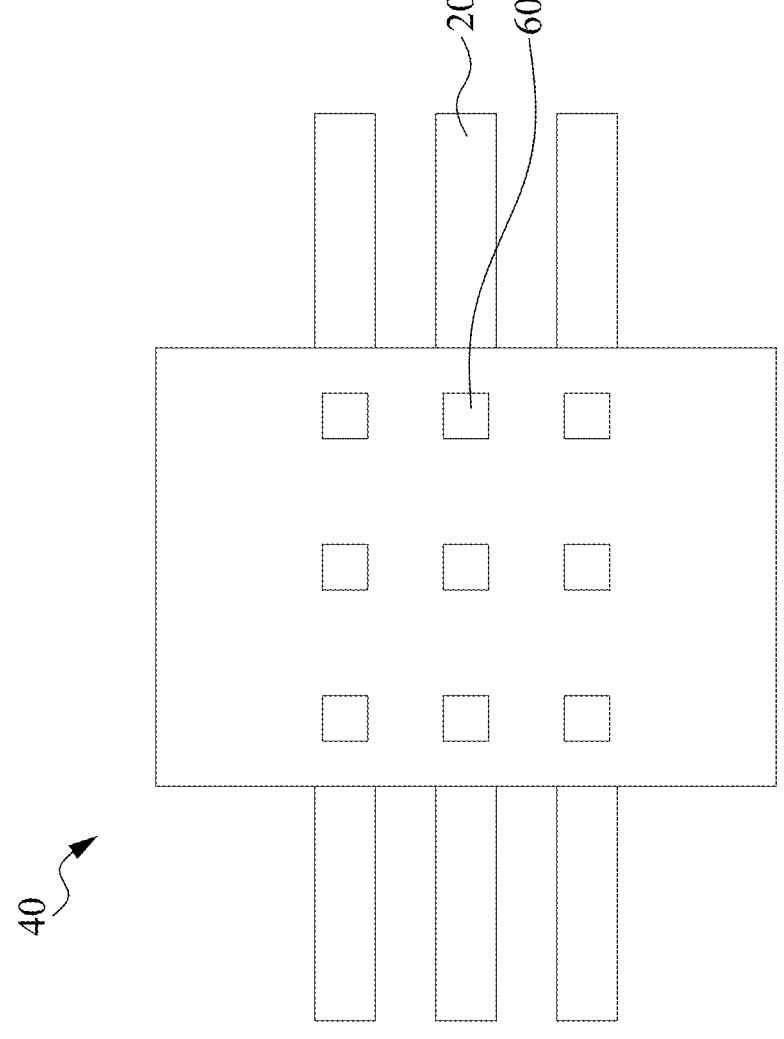

In some embodiments, there is one line of the dummy pillars 60 formed in the outermost edges of the gate stack 40 along the first direction D1 (as shown in FIGS. 14A to 14G). In some embodiments, there are two or more lines of the dummy pillars 60 formed in the outermost edges of the gate stack 40 along the first direction D1 (as shown in FIG. 14H). In some embodiments, the outermost edges of the gate stack 40 may not have any dummy pillars 60 (as shown in FIG. 14I).

Figure 14J:
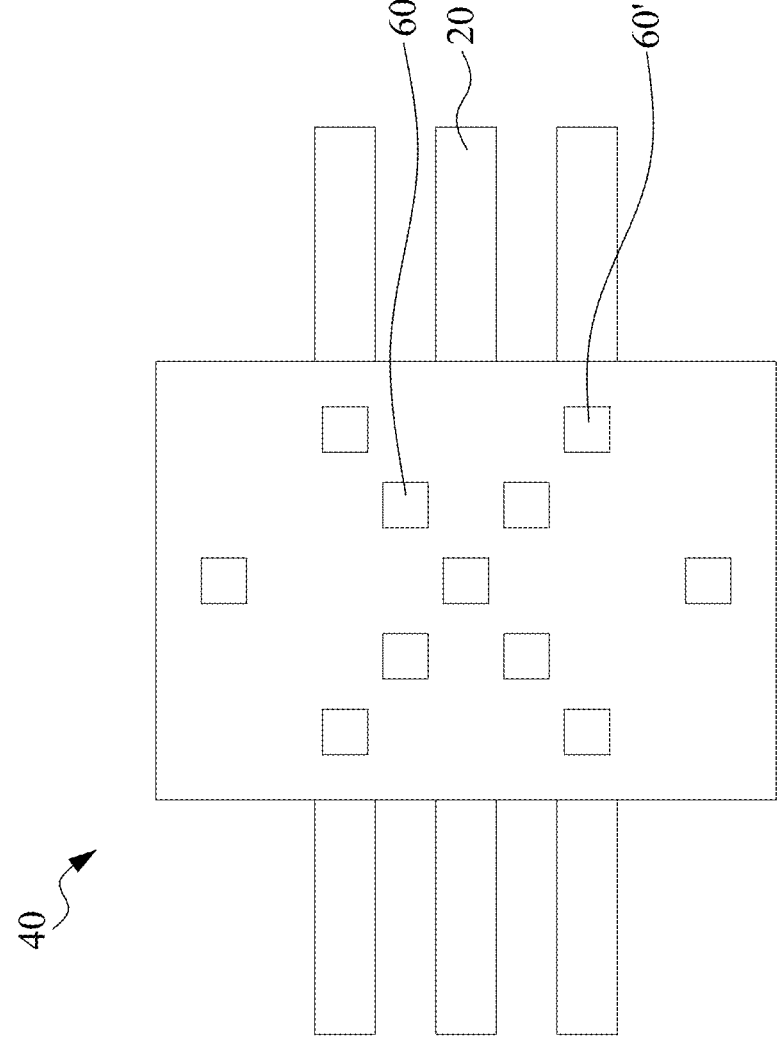

The dummy pillars 60 and 60' may be arranged in the gate stack 40 in any patterns. For example, as shown in FIG. 14J, the dummy pillars 60 formed in the first gate region 40A and/or the second gate region 40B of the gate stack 40 are arranged in an X pattern, but the disclosure is not limited thereto.

Figure 15:
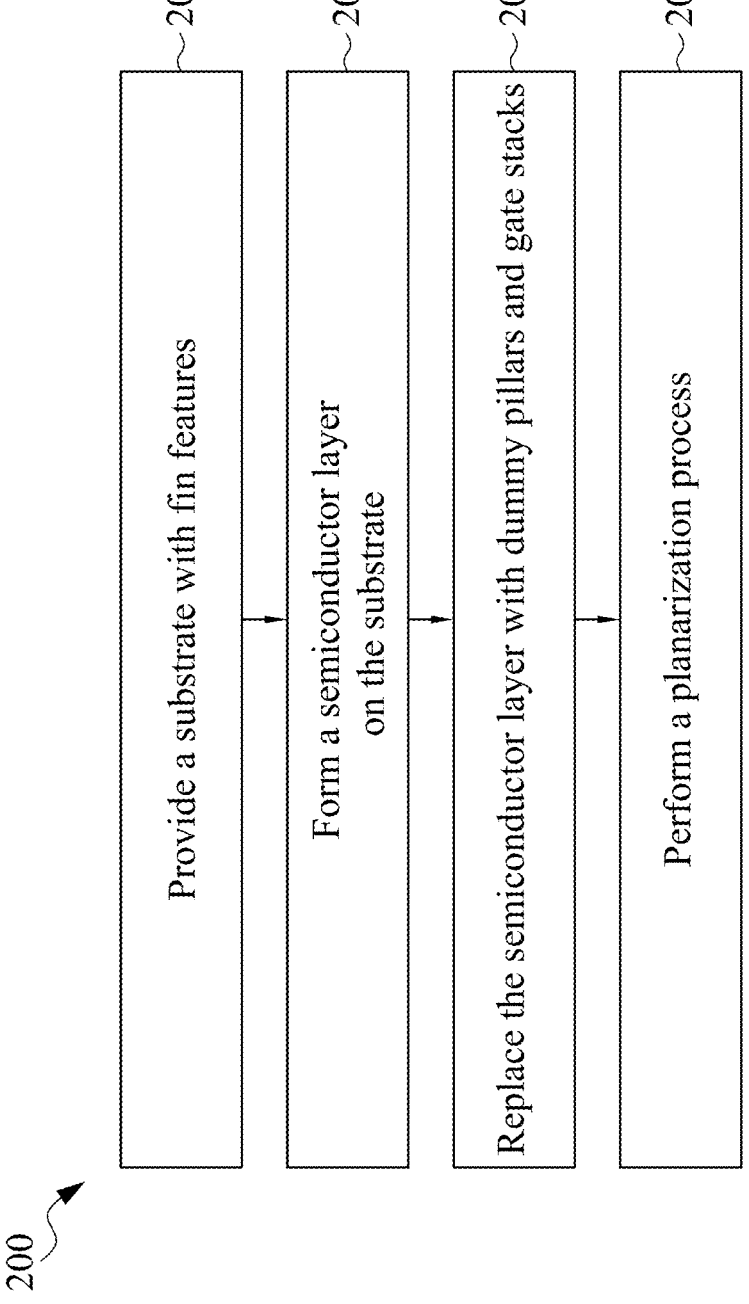
FIG. 15 is a flow diagram of a method of manufacturing a semiconductor structure in accordance with some embodiments of the present disclosure.

FIG. 15 is a flow chart of a method 200 for manufacturing a semiconductor structure according to various aspects of the present disclosure. In the present embodiment, the method 200 is for manufacturing a semiconductor structure that includes a fin structure. The method 200 includes a number of operations (201, 202, 203 and 204). The method for manufacturing the semiconductor structure 200 will be further described according to one or more embodiments. It should be noted that the operations of the method for manufacturing the semiconductor structure 200 may be rearranged or otherwise modified within the scope of the various aspects. It should further be noted that additional processes may be provided before, during, and after the method 200, and that some other processes may only be briefly described herein. Thus, other implementations are possible within the scope of the various aspects described herein. The operations of the method 200 in FIG. 15, including any descriptions given with reference to FIGS. 16A to 16H, FIGS. 17A to 17I and 18A to 18F, are merely exemplary and are not intended to be limiting beyond what is specifically recited in the claims that follow.

The method 200 begins at operation 201 where a substrate 20 with fin features 30 is provided or received. The fin features 30 may be formed by any suitable process, such as a photolithography and etching process. In some embodiments, the fin structures 20 are formed by exposing the photoresist layer to a pattern, performing a post-exposure bake process, and developing the photoresist layer to form a masking element. The photoresist layer patterning may include processing steps of photoresist coating, soft baking, mask aligning, exposing pattern, post-exposure baking, developing photoresist, and hard baking. In some embodiments, the fin features 30 may be formed by an etching process using a reactive ion etch (RIE) and/or other suitable process. In one example, a hydrofluoric acid (HF) or buffered HF may be used to etch the dielectric pad layer to expose the substrate 20 according to the pattern defined by the mask layer. In one example, a dry etching process used to etch the substrate 20 includes a chemistry including fluorine-containing gas. In a further example, the chemistry of the dry etch includes $CF_4$, $SF_6$, or $NF_3$. Alternatively, the fin features 30 are formed by a double-patterning lithography (DPL) process. It is understood that multiple parallel fin structures may be formed in a similar manner.

In some embodiments, the substrate 20 with fin features 30 is applied with a shallow trench isolation (STI) layer 22. The STI layer 22 may be formed by any suitable method. In some embodiments, the STI layer 22 may be made of an insulation material including an oxide, such as silicon oxide, a nitride, such as silicon nitride, the like, or a combination thereof, which may be formed by a chemical vapor deposition (CVD) process, such as high-density plasma CVD (HDP-CVD), flowable chemical vapor deposition (FCVD), the like, or a combination thereof. Other insulation materials formed by any acceptable process may be used. In some embodiments, the insulation material is silicon oxide formed by FCVD. Although the STI layer 22 is illustrated as a single layer, some embodiments may utilize multiple layers.

Figure 16A:
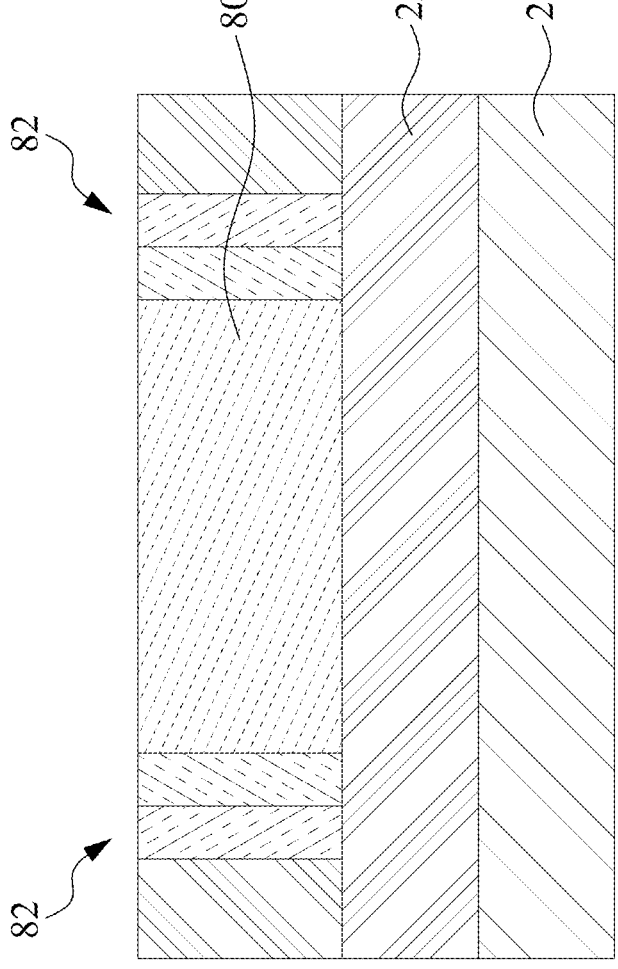
FIGS. 16A to 16H are cross-sectional side views illustrating various stages in a method for forming a semiconductor structure, in accordance with some embodiments.
Figure 17A:
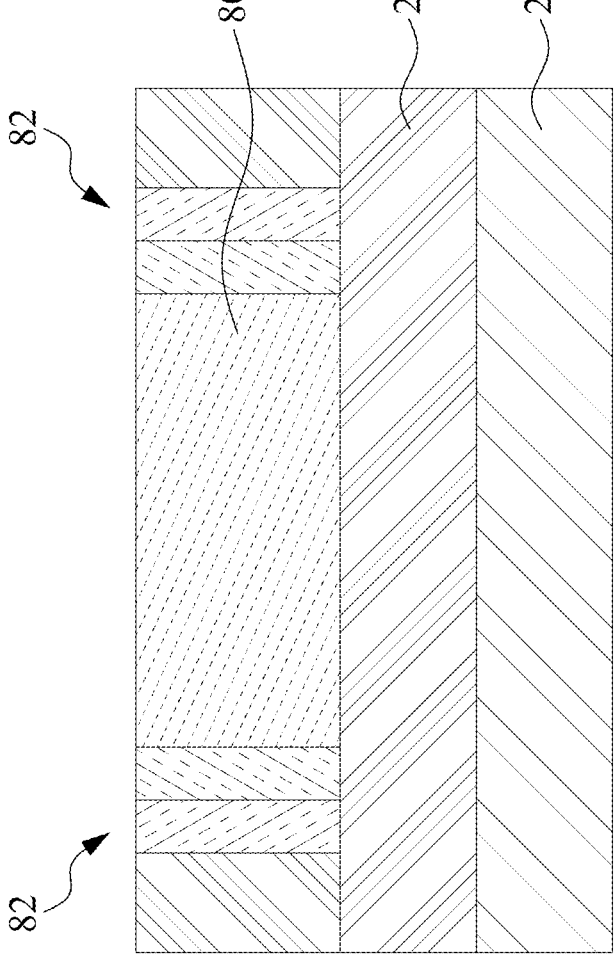
FIGS. 17A to 17I are cross-sectional side views illustrating various stages in a method for forming a semiconductor structure, in accordance with some embodiments.

At operation 202, as also shown in FIGS. 16A and 17A, a semiconductor layer 80 is formed on the STI layer 22 and thus is formed along sidewalls and over a top surface of the fin features 30. An interlayer dielectric (ILD) layer 82 may be also formed on the STI layer 22 so that the semiconductor layer 80 is surrounded by the ILD layer 82. The ILD layer 82 includes silicon oxide, oxynitride or other suitable materials. The ILD layer 82 includes a single layer or multiple layers as shown in FIGS. 16A and 17A. The ILD layer 82 is formed by a suitable technique, such as CVD, ALD and the like.

As illustrated in FIGS. 16B to 16G and 17B to 17G, the method 200 continues with operation 203 where the semiconductor layer 80 may be replaced with dummy pillars 60 and gate stacks 40, including forming a mask layer 300 over the semiconductor layer 80, partially removing the semiconductor layer 80 according to the pattern of the mask layer 300 to form first recesses 84 in the semiconductor layer 80, forming dummy pillars 60 in the first recesses 84, removing a remaining semiconductor layer 80 to form second recesses 86 in the semiconductor layer 80, and forming gate stacks 40 in the second recesses 86.

Figure 16B:
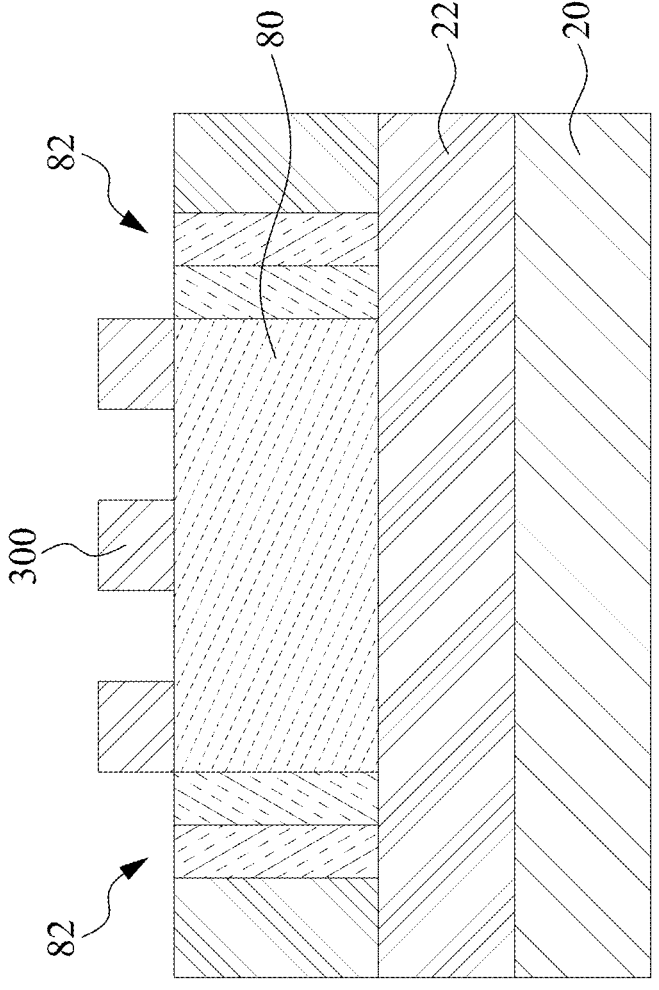
Figure 17B:
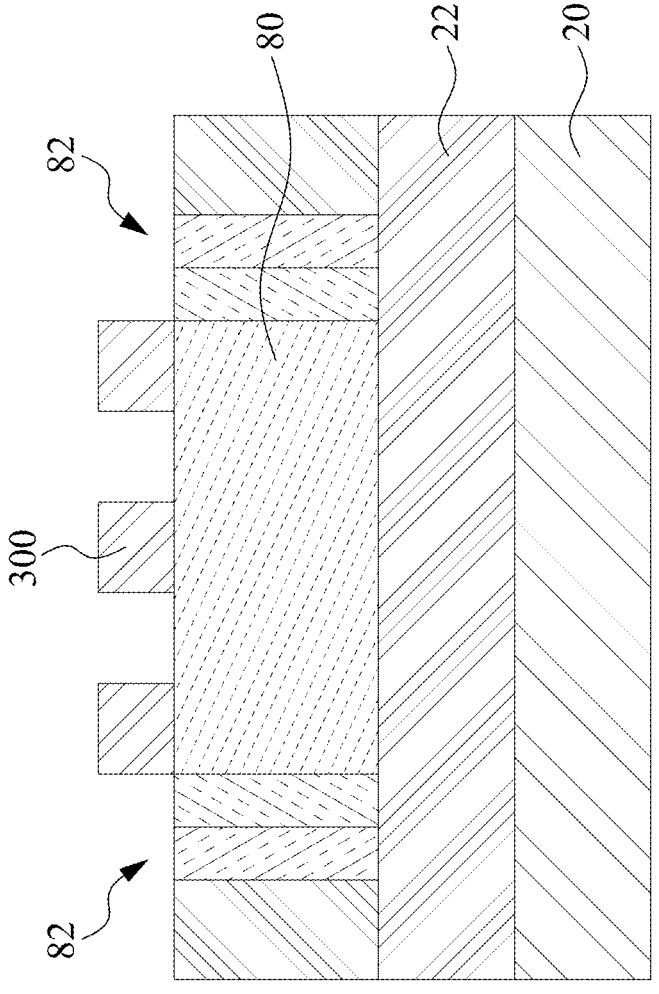

With reference to FIGS. 16B and 17B, the mask layer 300 is formed over the semiconductor layer 80 to define the location for forming the dummy pillars 60. In some embodiments, the mask layer 300 includes silicon nitride and is formed by a CVD process. The mask layer 300 may be a stop/hard mask layer. The mask layer 300 can be formed by any suitable process to any suitable thickness. The mask layer 300 may include a material such as silicon nitride, silicon oxide, silicon oxynitride, silicon carbide, silicon carbon nitride, other suitable material, or combinations thereof. In various examples, the silicon nitride can be formed by physical vapor deposition (PVD), atomic layer deposition (ALD), high density plasma CVD (HDPCVD), other suitable methods, and/or combinations thereof. The CVD process, for example, may use chemicals including hexachlorodisilane (HCD or $Si_2Cl_6$), dichlorosilane (DCS or $SiH_2C_{12}$), bis(tertiarybutylamino) silane (BTBAS or $C_8H_{22}N_2Si$) and disilane (DS or $Si_2H_6$). A photoresist layer may be formed over the mask layer. The photoresist layer is formed by any suitable process to any suitable thickness.

Figure 16C:
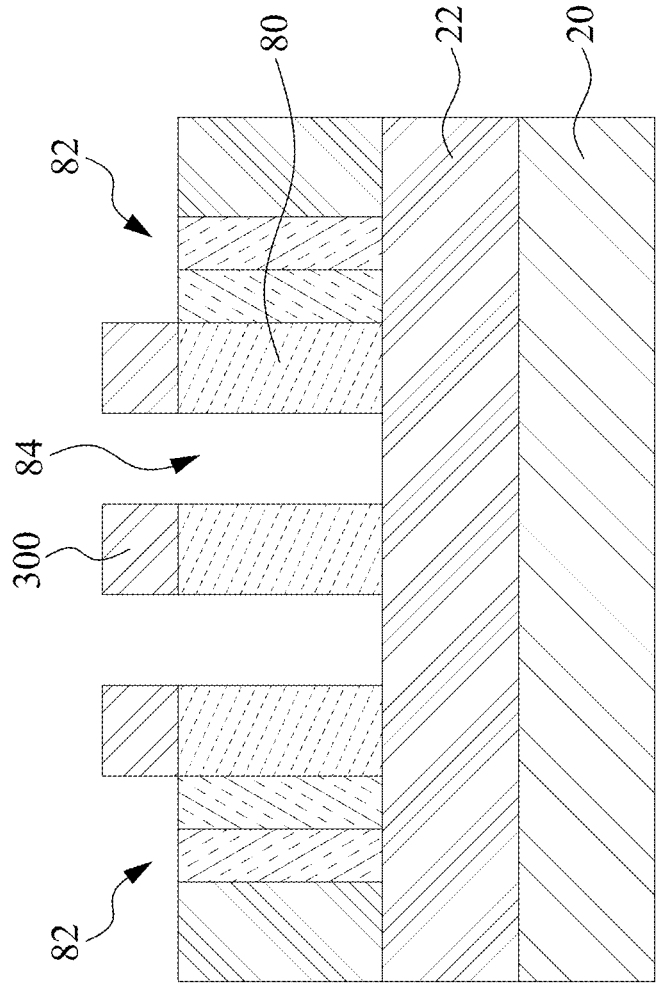
Figure 17C:
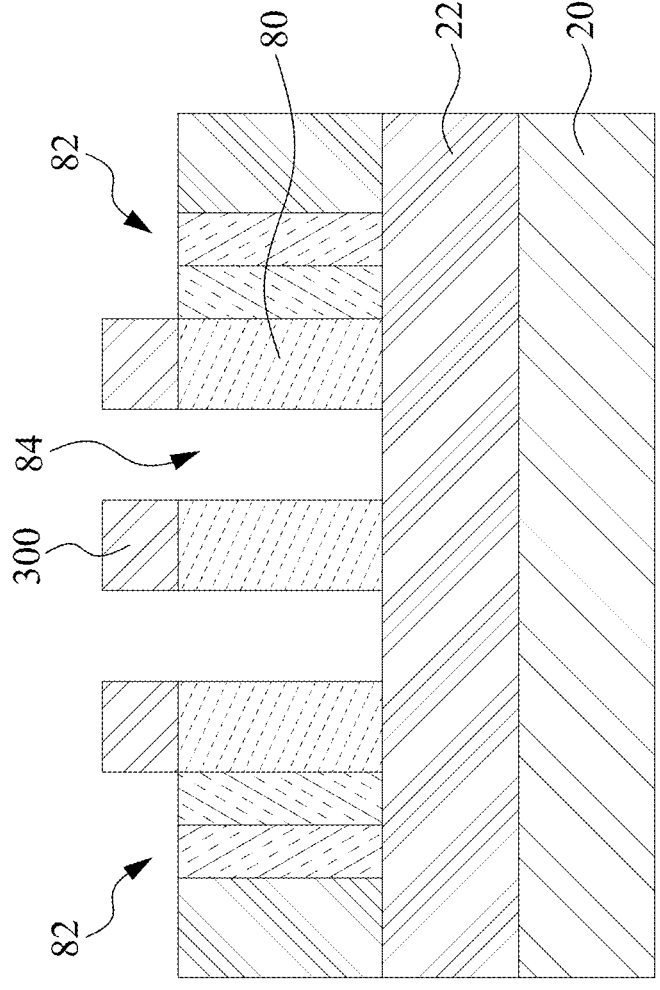

With reference to FIGS. 16C and 17C, the semiconductor layer 80 is partially removed according to the pattern of the mask layer 300 to form first recesses 84 in the semiconductor layer 80 to expose the top of the STI layer 22 and the fin features 30.

Figure 16D:
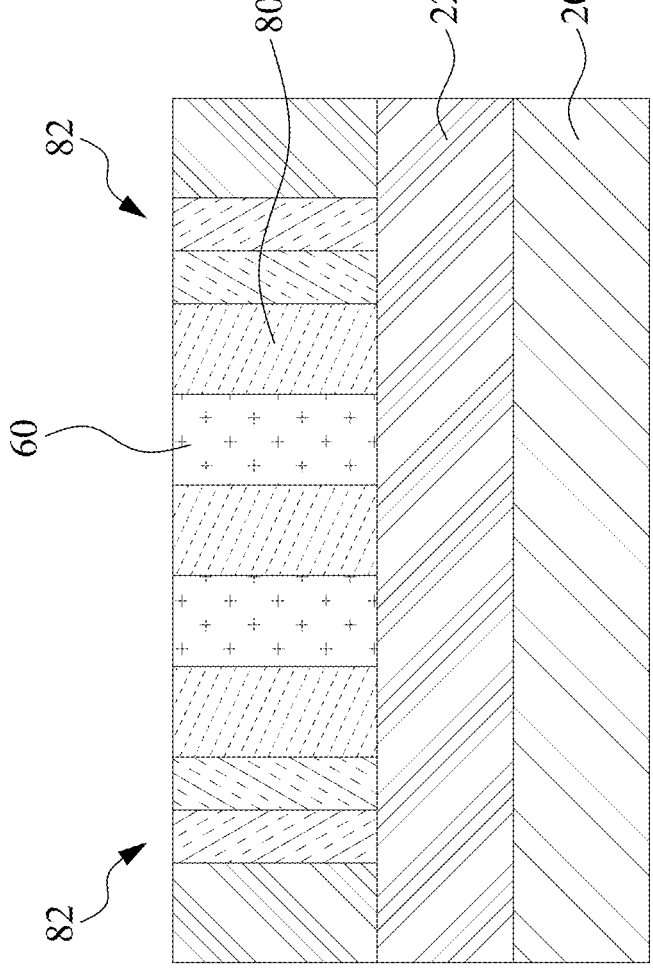
Figure 17D:
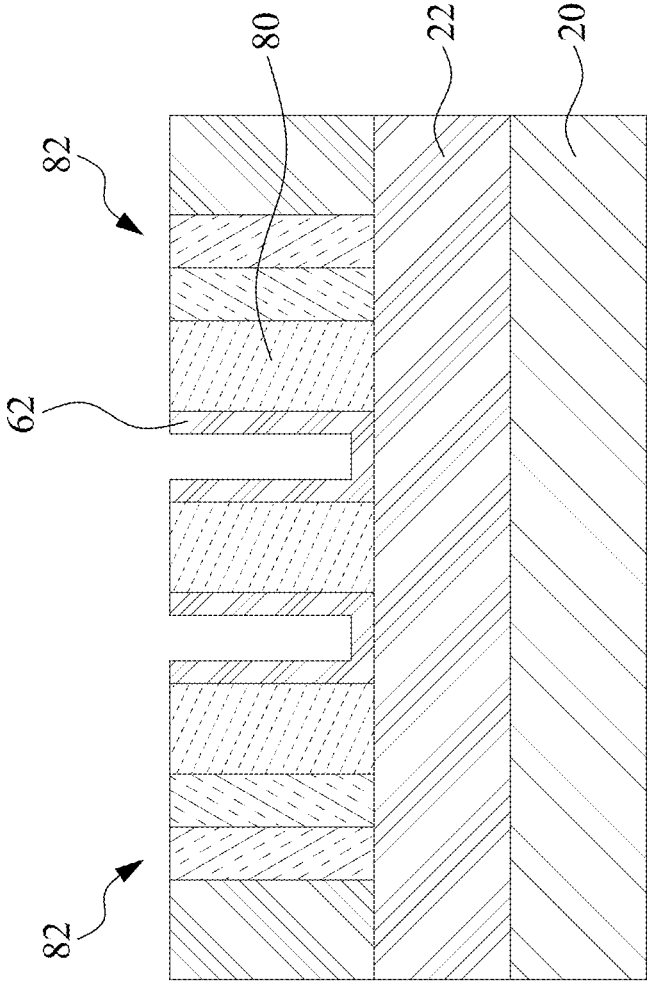
Figure 17E:
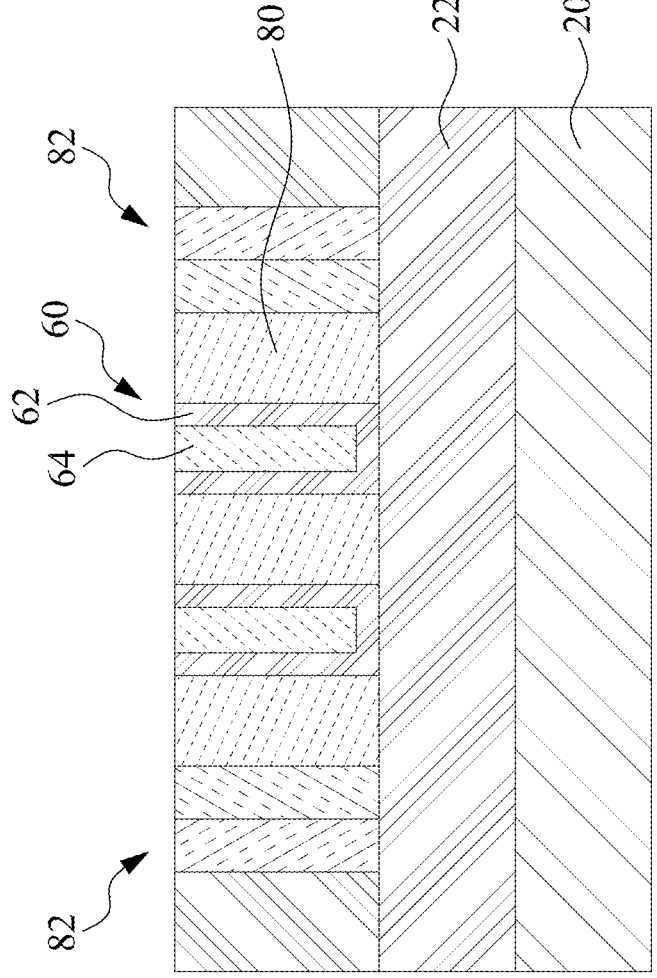

Further referring to FIGS. 16D, 17D and 17E, the dummy pillars 60 are formed in the first recesses 84. The dummy pillars 60 and remaining semiconductor layer 80 may be planarized through a CMP process. The dummy pillars 60 may be made of a single material as shown in FIG. 16D or may be made of a hybrid material as shown in FIGS. 17D and 17E. As shown in FIG. 16D, the first recesses 84 are filled with a single material, which includes, but not limited to dielectric materials (such as SiN, polyoxide, SiC and the like), metal materials (such as TiN, Co, W, Al and so on), metal oxides (such as AlO, ZrO and so on). As shown in FIGS. 17D and 17E, each first recess 84 is overlaid with a sheath layer 62 along a bottom and sidewalls of the first recess 84 and then a core layer 64 is formed in the sheath layer 62 so that the core layer 64 is surrounded by the sheath layer 62 to expose a top of the core layer 64. The sheath layer 62 may be made of nitrides (such as SiN) and the core layer 64 may be made of oxides (such as polyoxides, metal oxides and the like).

Figure 16E:
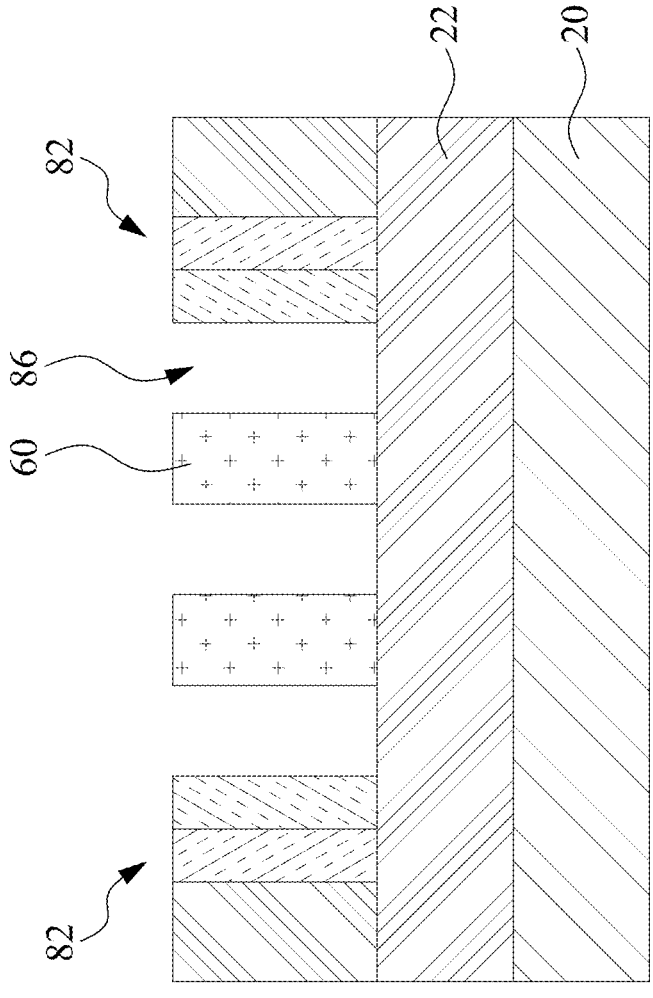
Figure 16F:
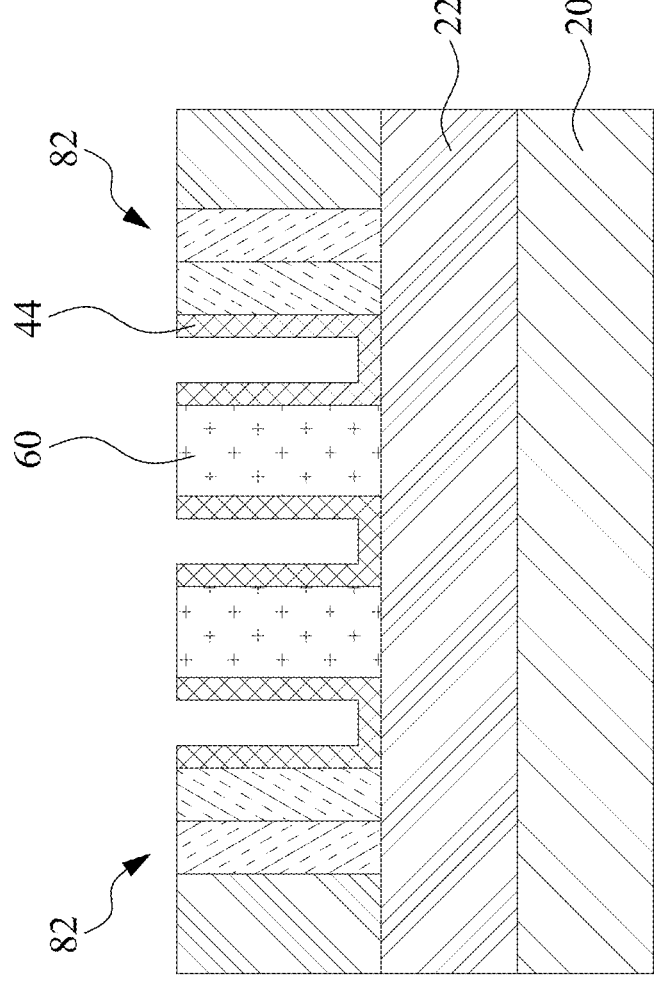
Figure 16G:
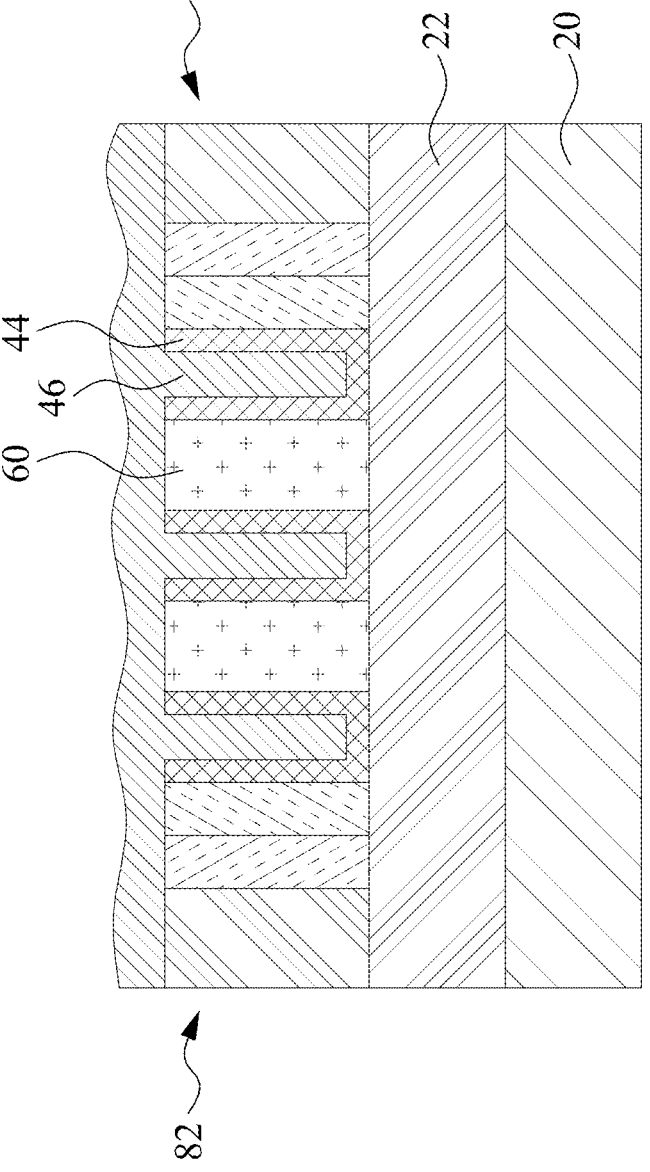
Figure 17F:
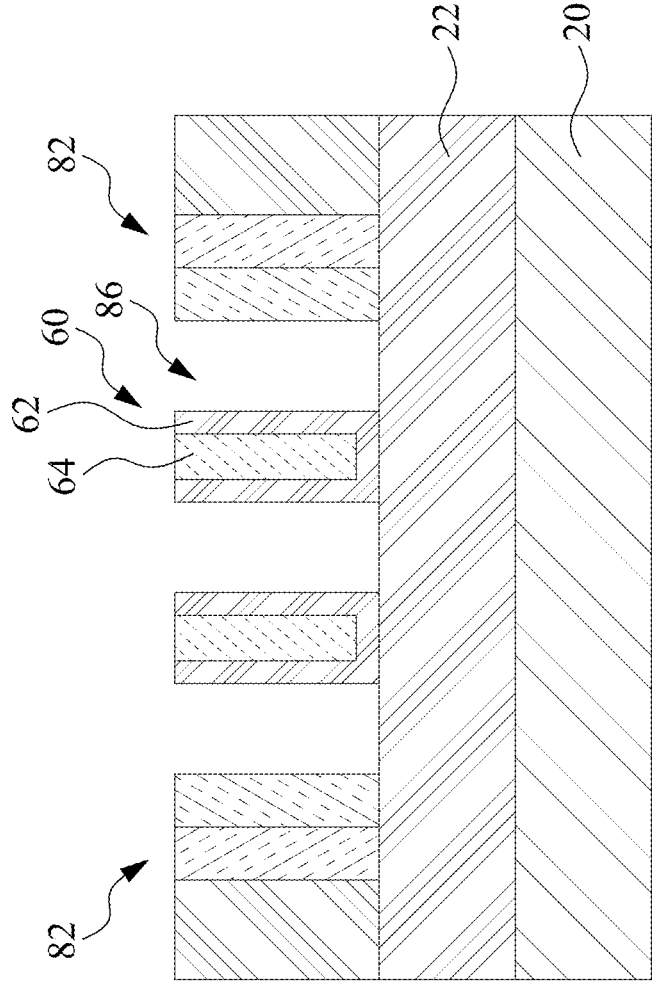
Figure 17G:
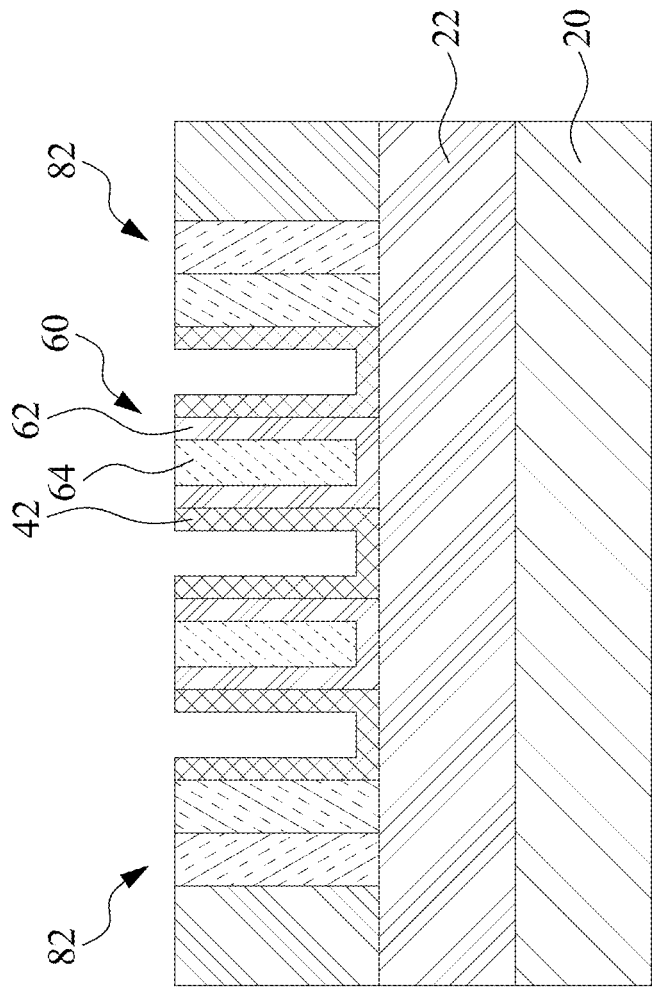
Figure 17H:
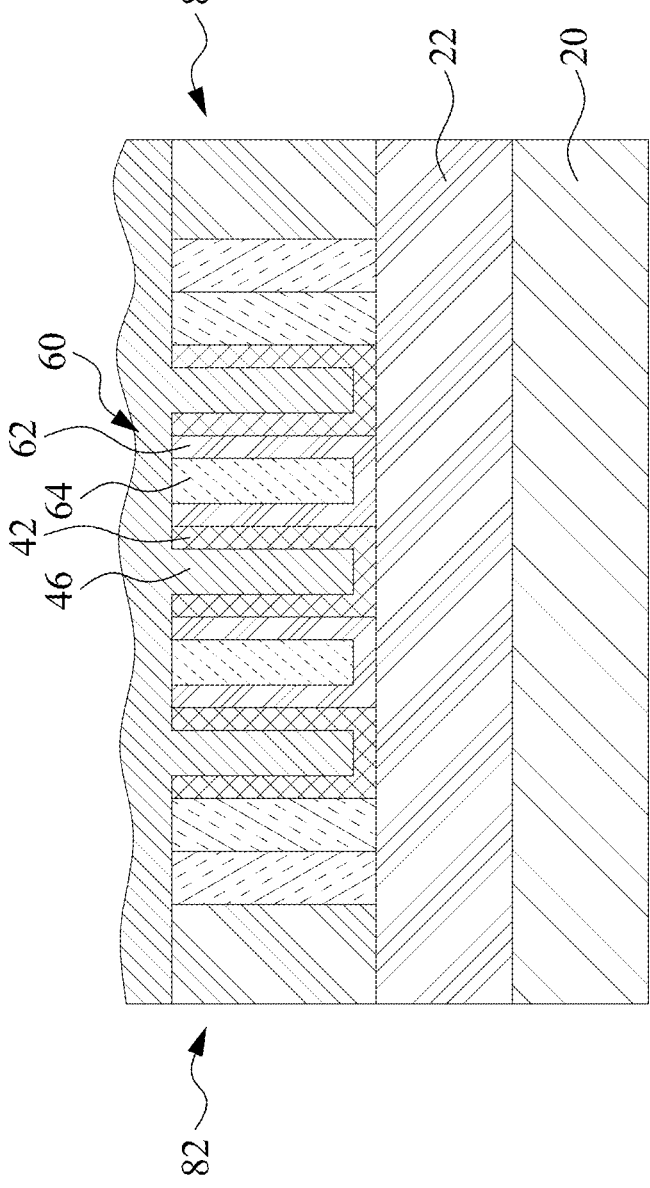

With reference to FIGS. 16E and 17F, the remaining semiconductor layer 80 is removed to form second recesses 86 through a mask layer (not shown). As shown in FIGS. 16F. 16G, 17G and 17H, gate stacks 40 are formed in the second recesses 86, including depositing a gate dielectric 44 on the top of the STI layer 22, on the fin features 30 and a sidewall of the second recess 86 and filling a conductive material to form a gate electrode 46.

In the embodiments of forming an NMOS transistor, the gate electrode 46 can be made of an n-type metal. The n-type metal is capable of providing a work function value that is suitable for the device, such as equal to or less than about 4.5 eV, such as from about 3.9 eV to 4.5 eV. The n-type metal may include metal, metal carbide, metal nitride, or a combination thereof. For example, the n-type metal includes titanium nitride, tantalum, tantalum nitride, another suitable material, or a combination thereof.

On the other hand, in the embodiments of forming a PMOS transistor, the gate electrode 46 can be made of a p-type metal. The p-type metal is capable of providing a work function value that is suitable for the device, such as equal to or greater than about 4.5 eV, such as from about 4.5 eV to about 5.2 eV. The p-type metal may include metal, metal carbide, metal nitride, other suitable materials, or a combination thereof. For example, the p-type metal includes tantalum nitride, tungsten nitride, titanium, titanium nitride, other suitable materials, or a combination thereof.

The gate electrode 46 may also be made of hafnium, zirconium, titanium, tantalum, aluminum, metal carbides (e.g., hafnium carbide, zirconium carbide, titanium carbide, aluminum carbide), aluminides, ruthenium, palladium, platinum, cobalt, nickel, conductive metal oxides, or a combinations thereof. The thickness and/or the compositions of the work function layer may be fine-tuned to adjust the work function level. For example, a titanium nitride layer may be used as a p-type metal layer or an n-type metal layer, depending on the thickness and/or the compositions of the titanium nitride layer.

Figure 16H:
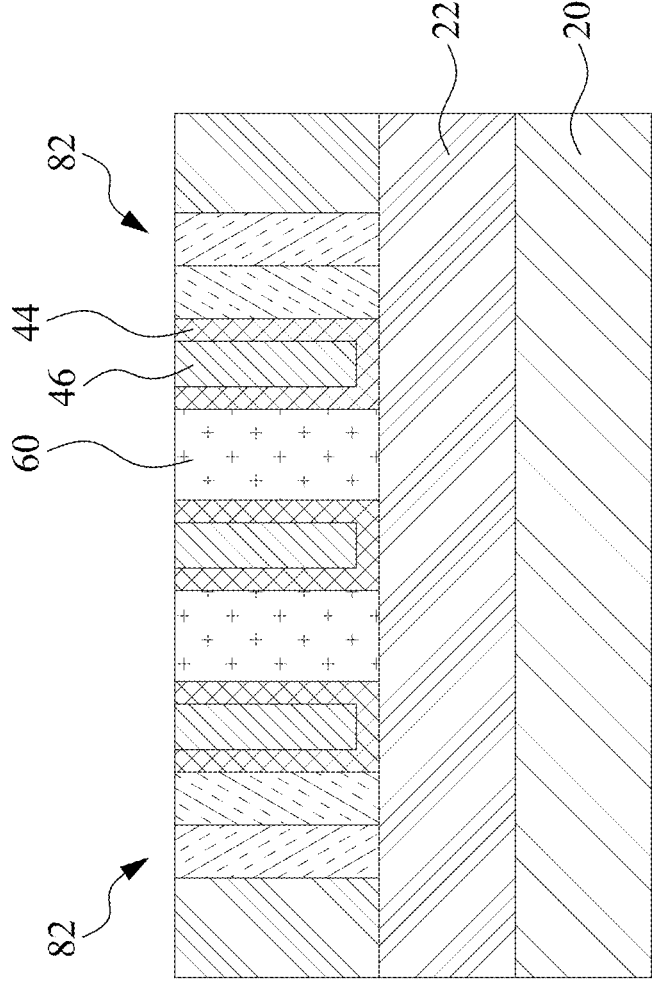
Figure 17I:
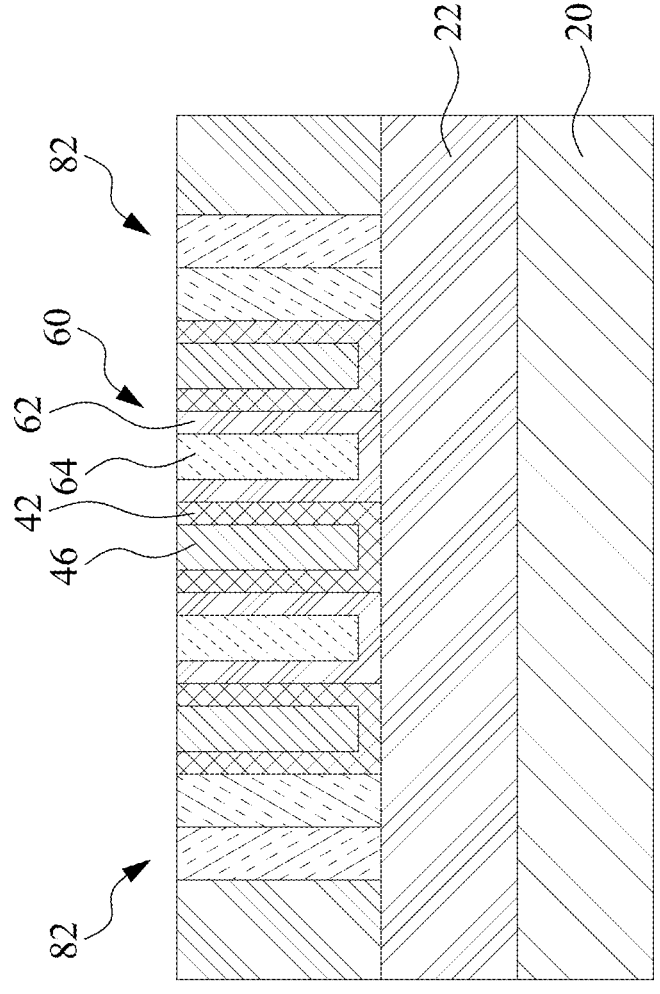

At operation 204, with reference to FIGS. 16H and 17I, a planarization process is performed so that the dummy pillars 60 and the gate stacks 40 are coplanar. In some embodiments, a CMP process may be performed.

Figure 18A:
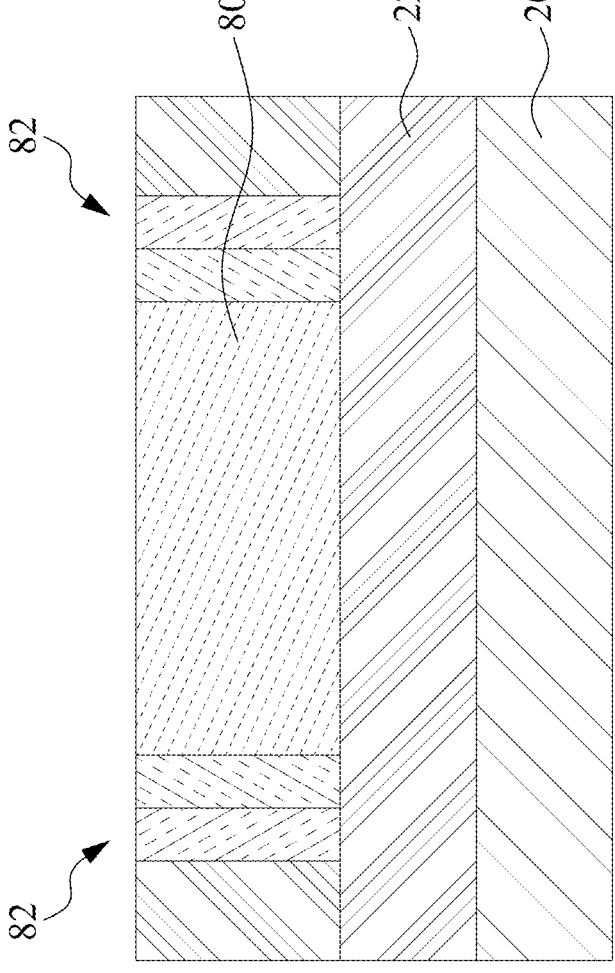
FIGS. 18A to 18F are cross-sectional side views illustrating various stages in a method for forming a semiconductor structure, in accordance with some embodiments.

FIGS. 18A to 18F show other embodiments of the method 200 in accordance with the present invention. At operation 201, as shown in FIG. 18A, a substrate 20 with fin features 30 is provided or received and is applied with a shallow trench isolation (STI) layer 22. At operation 202, a semiconductor layer 80 is formed on the STI layer 22 and thus is formed along sidewalls and over a top surface of the fin features 30. The semiconductor layer 80 is surrounded by an interlayer dielectric (ILD) layer 82. The semiconductor layer 80 includes a material used to form the dummy pillars 60, which includes, but not limited to dielectric materials (such as SiN, polyoxide, SiC and the like), metal materials (such as TiN, Co, W. Al and so on), metal oxides (such as AlO, ZrO and so on). The semiconductor layer 80 may be planarized through a CMP process.

As illustrated in FIGS. 18B to 18E, the method 200 continues with operation 203 where the semiconductor layer 80 may be replaced with dummy pillars 60 and gate stacks 40, including forming a mask layer 400 over the semiconductor layer 80, partially removing the semiconductor layer 80 according to the pattern of the mask layer 400 to form third recesses 88 to form dummy pillars 60 adjacent to the third recesses 88, and forming gate stacks 40 in the third recesses 88.

Figure 18B:
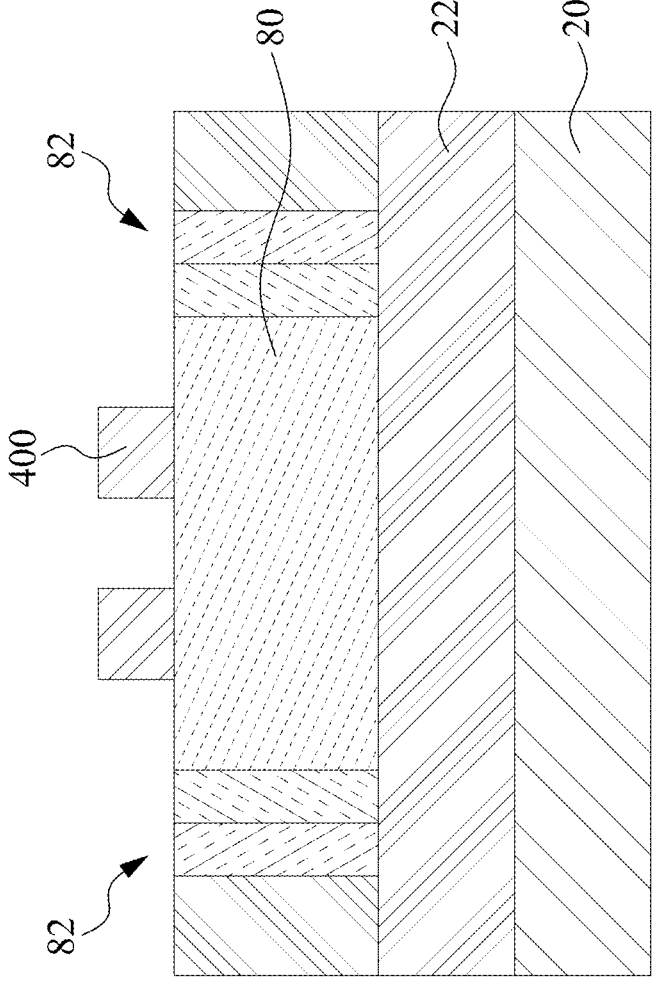

With reference to FIG. 18B, the mask layer 400 is formed over the semiconductor layer 80. The mask layer 400 is similar to the mask layer 300 mentioned above, but is used to define the location for forming the gate stacks 40.

Figure 18C:
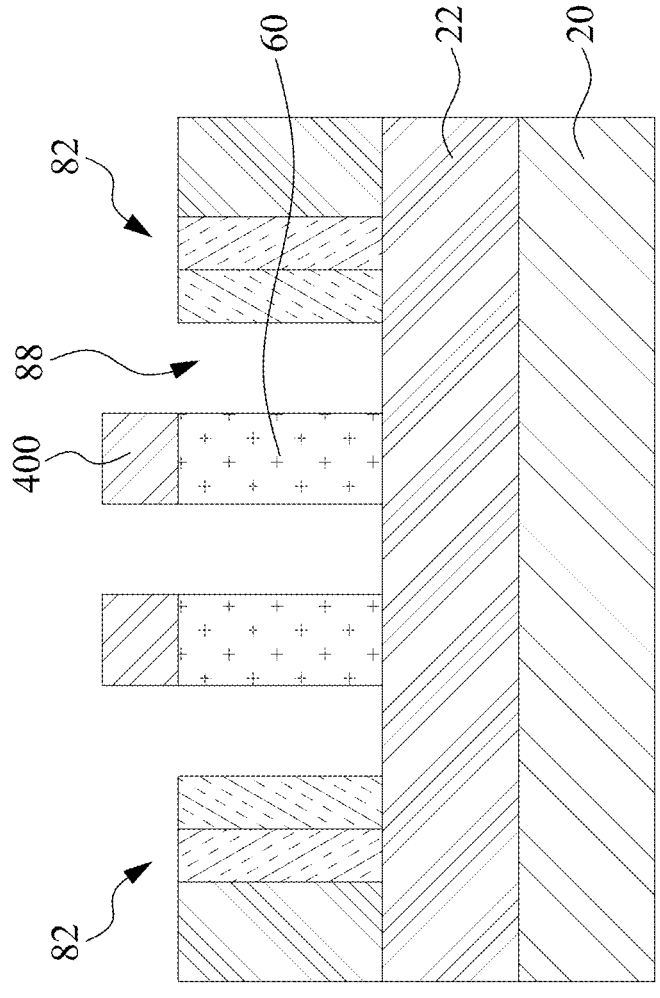

With reference to FIG. 18C, the semiconductor layer 80 is partially removed according to the pattern of the mask layer 400 to form third recesses 88 so that the top of the STI layer 22 and fin features 30 are exposed. The remaining semiconductor layer 80 can serve as the dummy pillars 60.

Figure 18D:
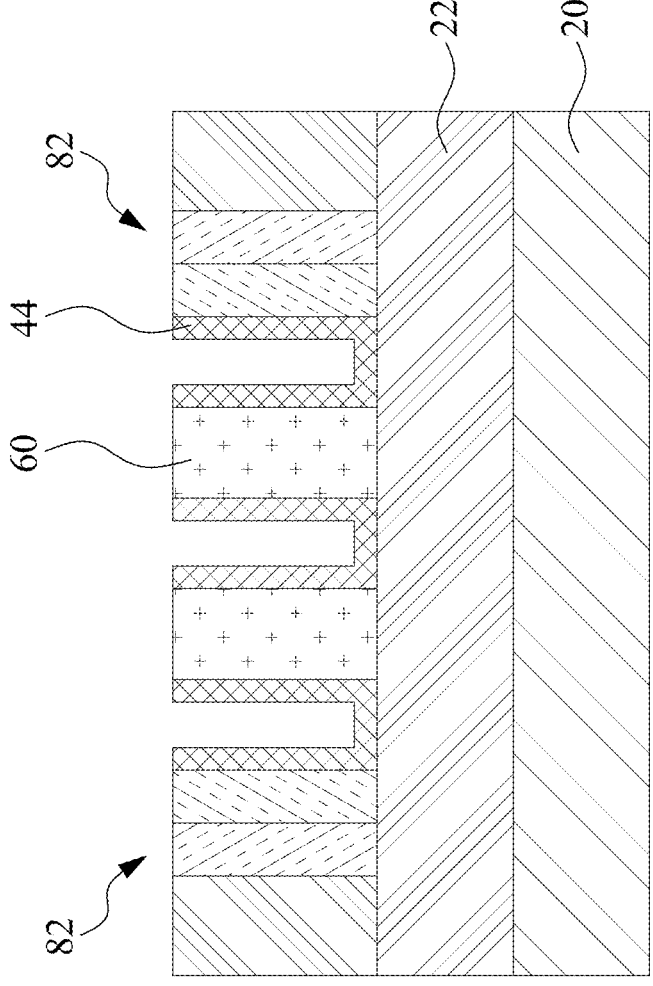
Figure 18E:
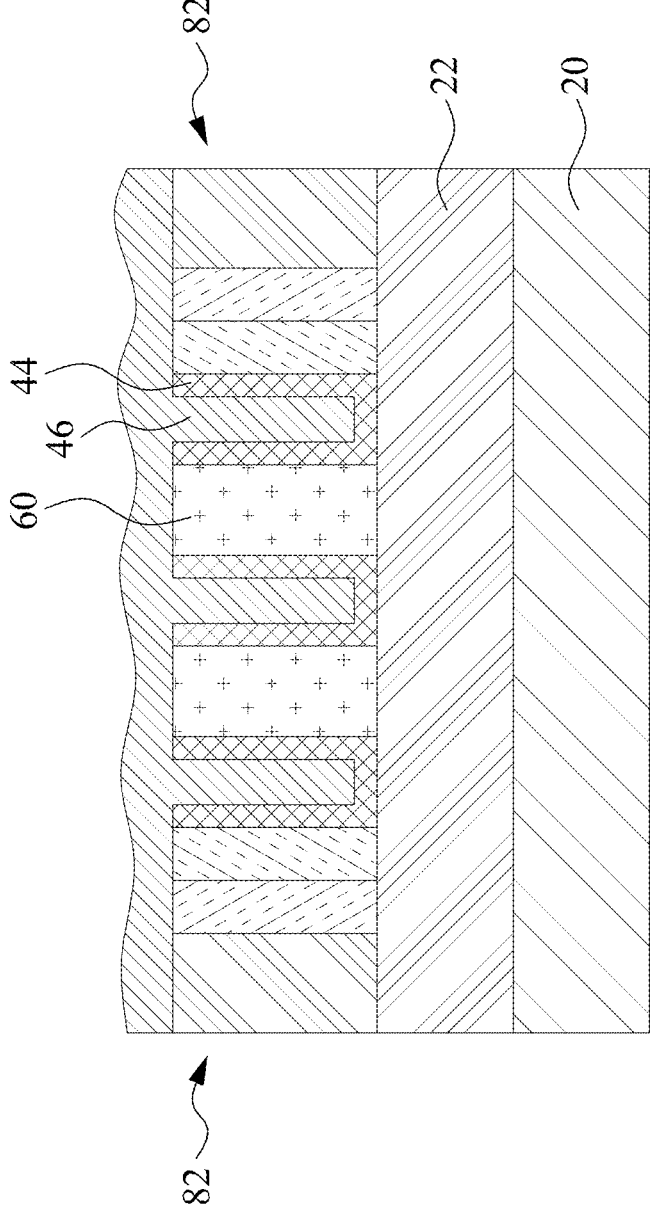

Further referring to FIGS. 18D and 18E, gate stacks 40 are formed in the third recesses 88, including depositing a gate dielectric 44 on the top of the STI layer 22, the fin features 30 and a sidewall of the third recess 88 and filling a conductive material to form a gate electrode 46.

11

Figure 18F:
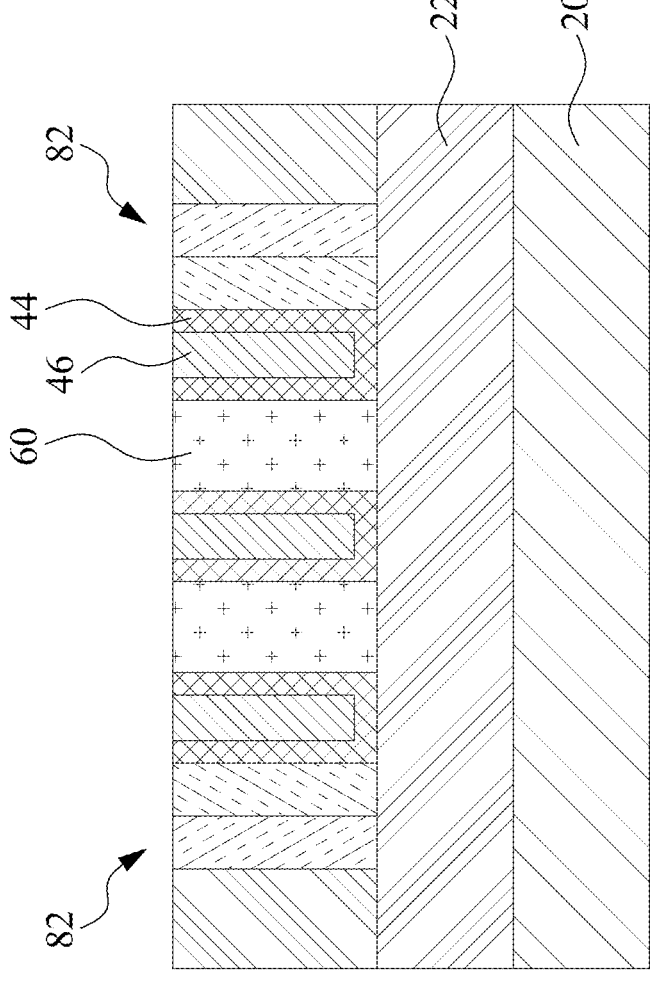

At operation 204, with reference to FIG. 18F, a planarization process is performed so that the dummy pillars 60 and the gate stacks 40 are coplanar.

Due to the dummy pillars 60, the gate stack 40 including the central region 42 can be planarized with eliminated defects, such as a convex surface, a concave surface (e.g., dishing) or the like. The contact 70 can be steadily landed on the top of the central region 42.

FIGS. 16 to 18 illustrate the dummy pillar 60 as an example, but the same operations can also be applied to the dummy pillar 60'. The difference is that the dummy pillars 60 are formed on the STI layer 22 while the dummy pillars 60' are formed on the fin features 30.

In some embodiments, a semiconductor structure comprises a substrate comprising fin features formed over the substrate and extending along a first direction; a plurality of gate stacks deposited over the substrate and extending along a second direction different from the first direction to cover the sidewalls and top surfaces of the fin features exposed from the substrate, each of the plurality of gate stacks comprising: a first gate region in which a portion of the fin features are located; a second gate region in which a portion of the fin features are located, which are different from the fin features located in the first gate region; and a central region formed between the first gate region and the second gate region without covering the fin features; and a plurality of dummy pillars formed on the substrate and formed in the central region of the gate stacks and formed besides the fin features in the first gate region and the second gate region of the gate stack.

In some embodiments, a semiconductor structure comprises a substrate comprising fin features formed over the substrate and extending along a first direction; a plurality of gate stacks deposited over the substrate and extending along a second direction different from the first direction to cover the sidewalls and top surfaces of the fin features exposed from the substrate, each of the plurality of gate stacks comprising: a first gate region in which a portion of the fin features are located; a second gate region in which a portion of the fin features are located, which are different from those located in the first gate region; and a central region formed between the first gate region and the second gate region without covering the fin features; and a plurality of dummy pillars formed on the fin features in the first gate region and the second gate region and formed on the substrate in the central region of the gate stacks.

In some embodiments, a method of manufacturing a semiconductor structure, comprising: forming a semiconductor layer on a substrate with fin features; replacing the semiconductor layer with dummy pillars and gate stacks; and performing a planarization process so that the dummy pillars and the gate stacks are coplanar.

The foregoing outlines features of several embodiments so that those skilled in the art may better understand the aspects of the present disclosure. Those skilled in the art should appreciate that they may readily use embodiments of the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

12

What is claimed is:

1. A semiconductor structure, comprising:
a substrate comprising fin features formed over the substrate and extending along a first direction;
a plurality of gate stacks deposited over the substrate and extending along a second direction different from the first direction to cover the sidewalls and top surfaces of the fin features exposed from the substrate, each of the plurality of gate stacks comprising:
a first gate region in which a portion of the fin features are located;
a second gate region in which a portion of the fin features are located, which are different from the fin features located in the first gate region; and
a central region formed between the first gate region and the second gate region without covering the fin features; and
a plurality of dummy pillars formed on the fin features in the first gate region and the second gate region, formed on the substrate in the central region of the gate stacks and formed besides the fin features in the first gate region and the second gate region of the gate stack.

2. The semiconductor structure of claim 1, wherein the central region abuts one or more of the plurality of dummy pillars in the first gate region and abuts one or more of the plurality of dummy pillars in the second gate region.

3. The semiconductor structure of claim 1, wherein each of the plurality of dummy pillars is made of a single material selected from a dielectric material, a metal material, or a metal oxide.

4. The semiconductor structure of claim 1, wherein each of the plurality of dummy pillars is made of a hybrid material and each of the plurality of dummy pillars comprises:
a sheath layer formed on the substrate and abutting the gate stacks; and
a core layer surrounded by the sheath layer to expose a top of the core layer.

5. The semiconductor structure of claim 4, wherein the sheath layer includes nitrides and the core layer includes oxides.

6. The semiconductor structure of claim 2, wherein the central region comprises a conductive layer and a barrier serving as a bottom and a sidewall of the conductive layer.

7. The semiconductor structure of claim 1, wherein a top of each of the plurality of dummy pillar is coplanar with a top of each of the plurality of gate stacks.

8. The semiconductor structure of claim 1, wherein each of the first gate region and the second gate region comprises:
a gate dielectric formed along sidewalls and over a top surface of the fin feature and along sidewalls of the plurality of the dummy pillars in the first gate region and the second gate region; and
a gate electrode formed in the gate dielectric to expose a top of the gate electrode.

9. A semiconductor structure, comprising:
a substrate comprising fin features formed over the substrate and extending along a first direction;
a plurality of gate stacks deposited over the substrate and extending along a second direction different from the first direction to cover the sidewalls and top surfaces of the fin features exposed from the substrate, each of the plurality of gate stacks comprising:

a first gate region in which a portion of the fin features are located;

a second gate region in which a portion of the fin features are located, which are different from the fin features located in the first gate region; and a central region formed between the first gate region and the second gate region without covering the fin features; and a plurality of dummy pillars formed on the fin features in the first gate region and the second gate region and formed on the substrate in the central region of the gate stacks.

10. The semiconductor structure of claim 9, wherein each of the plurality of dummy pillars is made of a single material selected from a dielectric material, a metal material, or a metal oxide.

11. The semiconductor structure of claim 9, wherein each of the plurality of dummy pillars is made of a hybrid material and each of the plurality of dummy pillars comprises:

a sheath layer formed on one of the fin features and abutting the gate stacks; and a core layer surrounded by the sheath layer to expose a top of the core layer.

12. The semiconductor structure of claim 11, wherein the sheath layer includes nitrides and the core layer includes oxides.

13. The semiconductor structure of claim 9, wherein a number of the plurality of dummy pillars on one of the fin features is identical to or different from a number of the plurality of dummy pillars on an adjacent one of the fin features.

14. The semiconductor structure of claim 9, wherein a top of each of the plurality of dummy pillar is coplanar with a top of each of the plurality of gate stacks.

15. The semiconductor structure of claim 9, wherein the gate stack comprises:

a gate dielectric formed on the substrate and along sidewalls of the fin feature and also along sidewalls of the dummy pillars; and a gate electrode formed in the gate dielectric to expose a top of the gate electrode.

16. A method of manufacturing a semiconductor structure, comprising:

forming a semiconductor layer on a substrate with fin features; and replacing the semiconductor layer with dummy pillars and gate stacks, comprising:

forming a mask layer over the semiconductor layer to define the location for forming the gate stacks;

partially removing the semiconductor layer to form first recesses, wherein a remaining semiconductor layer serves as the dummy pillars; and forming gate stacks in the first recesses.

17. The method of claim 16, wherein forming gate stacks in the first recesses comprises:

depositing a gate dielectric along bottoms and sidewalls of the second recesses; and filling the second recesses with a conductive material to form gate electrodes.

18. The method of claim 16, further comprising performing a planarization process after the gate stacks are formed so that the dummy pillars and the gate stacks are substantially coplanar.

19. The method of claim 16, wherein a number of the dummy pillars formed on one of the fin features is identical to or different from a number of the dummy pillars formed on an adjacent one of the fin features.

20. The method of claim 16, wherein when forming the semiconductor layer on the substrate with the fin features, the semiconductor layer is surrounded by an interlayer dielectric (ILD) layer.

* * * * *